United States Patent
Ikura

(10) Patent No.: US 12,414,348 B2
(45) Date of Patent: Sep. 9, 2025

(54) INSULATED GATE BIPOLAR TRANSISTOR

(71) Applicant: Fuji Electric Co., Ltd., Kanagawa (JP)

(72) Inventor: Yoshihiro Ikura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 479 days.

(21) Appl. No.: 17/878,812

(22) Filed: Aug. 1, 2022

(65) Prior Publication Data
US 2023/0072478 A1  Mar. 9, 2023

(30) Foreign Application Priority Data

Sep. 8, 2021 (JP) .................. 2021-146153

(51) Int. Cl.
*H10D 64/00* (2025.01)
*H10D 12/00* (2025.01)
(Continued)

(52) U.S. Cl.
CPC ......... *H10D 64/117* (2025.01); *H10D 12/481* (2025.01); *H10D 62/393* (2025.01); *H10D 84/617* (2025.01)

(58) Field of Classification Search
CPC ............... H01L 29/407; H01L 27/0664; H01L 29/1095; H01L 29/7397; H01L 29/0696;
(Continued)

(56) References Cited

U.S. PATENT DOCUMENTS

2018/0323294 A1  11/2018  Okuda et al.
2019/0027472 A1*  1/2019  Naito ................ H01L 29/42376
(Continued)

FOREIGN PATENT DOCUMENTS

JP  2017-147431 A  8/2017
JP  2019-057702 A  4/2019
(Continued)

OTHER PUBLICATIONS

K. Nishi et al., "CSTBT(TM) Based Split-Gate RC-IGBT with Low Loss and EMI Noise", Proceedings of the 32nd International Symposium on Power Semiconductor Devices & ICs (ISPSD), Sep. 2020, pp. 138-141 (Mentioned on paragraph Nos. 3-4 and 6 of the application.).

(Continued)

*Primary Examiner* — Patricia D Valenzuela
(74) *Attorney, Agent, or Firm* — CHEN YOSHIMURA LLP

(57) ABSTRACT

An insulated gate bipolar transistor includes: a gate electrode embedded in a gate trench through a gate insulating film, the gate trench penetrating an emitter region and a base region; and a dummy electrode embedded in a dummy trench through a dummy insulating film, the dummy trench penetrating the emitter region and the base region and being disposed on each side of the gate trench and laterally spaced from each side of the gate trench so as to laterally face the gate trench through the base region, wherein the dummy electrode includes a bottom dummy conductive member disposed at a bottom of the dummy trench such that an upper surface of the bottom dummy conductive member is located lower than a lower surface of the base region, the bottom dummy conductive member being configured to be electrically connected to a gate potential.

10 Claims, 23 Drawing Sheets

(51) Int. Cl.
*H10D 62/17* (2025.01)
*H10D 84/60* (2025.01)

(58) Field of Classification Search
CPC ........... H01L 29/42376; H01L 29/4238; H01L 27/0629; H10D 64/117; H10D 12/481; H10D 62/393; H10D 84/617; H10D 62/127; H10D 64/518; H10D 64/519; H10D 84/811
See application file for complete search history.

(56) References Cited

U.S. PATENT DOCUMENTS

| | | |
|---|---|---|
| 2019/0088769 A1 | 3/2019 | Matsushita |
| 2020/0144403 A1* | 5/2020 | Nishi .................... H01L 29/407 |
| 2022/0157976 A1 | 5/2022 | Konishi et al. |

FOREIGN PATENT DOCUMENTS

| | | |
|---|---|---|
| JP | 2020-77727 A | 5/2020 |
| JP | 2022-078755 A | 5/2022 |
| WO | 2017/126167 A1 | 7/2017 |
| WO | 2018/074427 A1 | 4/2018 |

OTHER PUBLICATIONS

Japanese Office Action dated Apr. 30, 2025 in a counterpart Japanese patent application No. 2021-146153. (A machine translation (not reviewed for accuracy) attached.).

\* cited by examiner

INSULATED GATE BIPOLAR TRANSISTOR

BACKGROUND OF THE INVENTION

Technical Field

The present invention relates to a trench gate type insulated gate bipolar transistor (IGBT).

Background Art

Conventionally, in a trench gate type IGBT, a high withstand voltage can be maintained even if a high-concentration carrier accumulation layer is provided by arranging the gate trench spacing narrowly. In that case, the density of the gate trenches becomes high, and the total gate charge Qg increases. Therefore, the increase in the total gate charge Qg is eliminated by forming dummy trenches where some of the gate trenches are connected to the emitter potential. However, by providing the dummy trenches, the potential around the gate trenches is lowered, and the gate-collector capacitance $C_{GC}$ increases during the turn-on of the IGBT, which causes the generation of the collector voltage tail. Therefore, the turn-on loss increases.

Non-Patent Document 1 proposes a split gate structure in which an electrode in a gate trench is divided into an upper part and a lower part, and an upper electrode is connected to a gate potential and a lower electrode is connected to an emitter potential. The split gate structure reduces the gate-collector capacitance $C_{GC}$ and realizes a low-loss IGBT. Further, in Patent Document 1, the electrode of the dummy trench is divided into two, and the upper conductive member is connected to the emitter potential and the lower conductive member is connected to the gate potential to adjust the gate-collector capacitance $C_{GC}$ as well as the collector-emitter capacitance $C_{CE}$.

Since the lower electrode of the gate trench of Non-Patent Document 1 and the upper conductive portion of Patent Document 1 are connected to the emitter potential, it is difficult to perform a screening using the withstand voltage test of the insulating film of the gate trench or dummy trench by applying a voltage. Although it is possible to perform such a screening in the middle of the manufacturing process, that would cause an increase in manufacturing cost. In Patent Document 1, since the gate electrodes are adjacent to each other, the holes accumulated on the upper surface side at the time of turn-on push the potential upwards, and the displacement current flows through the gate electrode. Therefore, the rate of change of the transient current di/dt increases and noise increases.

RELATED ART DOCUMENT

Patent Document

Patent Document 1: International publication No. 2018/074427

Non-Patent Document

Non-Patent Document 1: K. Nishi et al., "CSTB™ Based Split-Gate RC-IGBT with Low Loss and ENE Noise", Proceedings of the 32nd International Symposium on Power Semiconductor Devices & ICs (ISPSD), September 2020, pp. 138-141.

SUMMARY OF THE INVENTION

In view of the above problems, it is an object of the present invention to provide an insulated gate bipolar transistor capable of reducing turn-on loss and for which a screening for a gate insulating film can be performed with relative ease.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an insulated gate bipolar transistor, comprising: a drift layer made of semiconductor of a first conductivity type; a base region made of semiconductor of a second conductivity type on the drift layer; an emitter region made of semiconductor of the first conductivity type on the base region, an impurity concentration of the emitter region being higher than that in the drift layer; a gate electrode embedded in a gate trench through a gate insulating film, the gate trench penetrating the emitter region and the base region; and a dummy electrode embedded in a dummy trench through a dummy insulating film, the dummy trench penetrating the emitter region and the base region and being disposed on each side of the gate trench and laterally spaced from each side of the gate trench so as to laterally face the gate trench through the base region, wherein the gate electrode is configured to be electrically connected to a gate potential, and wherein the dummy electrode includes a bottom dummy conductive member disposed at a bottom of the dummy trench such that an upper surface of the bottom dummy conductive member is located lower than a lower surface of the base region, the bottom dummy conductive member being configured to be electrically connected to the gate potential.

According to the present invention, it is possible to provide an insulated gate bipolar transistor capable of reducing turn-on loss and for which a screening for a gate insulating film can be performed with relative ease.

It is to be understood that both the foregoing general description and the following detailed description are exemplary and explanatory, and are intended to provide further explanation of the invention as claimed.

DETAILED DESCRIPTION OF EMBODIMENTS

Figure 1:
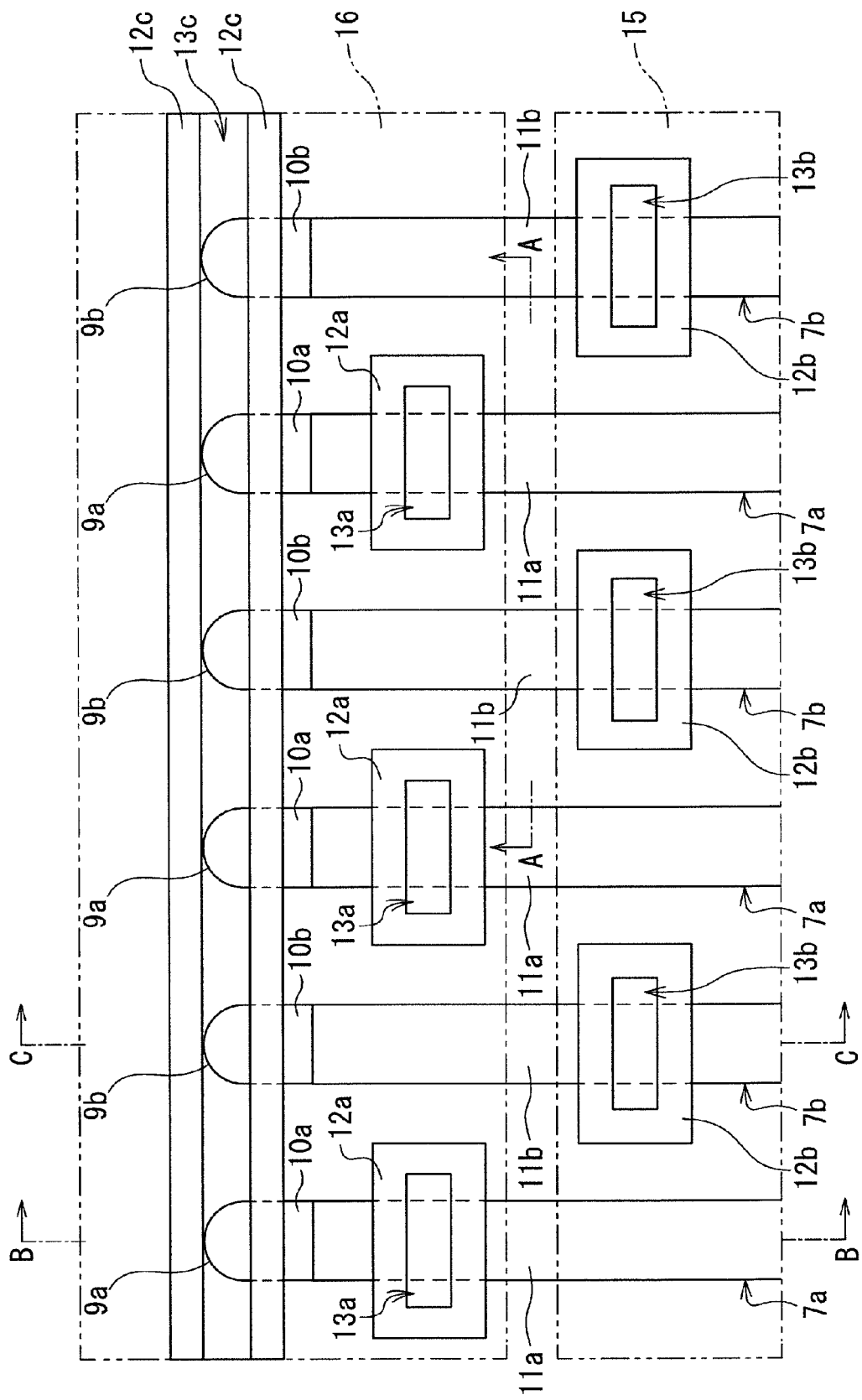
FIG. 1 is a schematic plan view showing an example of an IGBT according to a first embodiment of the present invention.

Hereinafter, embodiments of the present invention will be described with reference to the drawings. In the description of the drawings referred to in the following description, the same or similar parts are designated by the same or similar reference numerals. However, it should be noted that the drawings are schematic, and the relationship between the thickness and the plane dimensions, the ratio of the thickness of the respective layers, etc., are different from the actual ones. Therefore, the specific thickness and dimensions should be determined in consideration of the following explanation. In addition, it goes without saying that parts having different dimensional relationships and ratios may be included among the various drawings.

Further, the definition of the direction such as up and down in the following description is used merely for convenience of explanation, and does not limit the technical idea of the present invention. For example, if the object is rotated by 90° and observed, the top and bottom are converted to left and right, and if the object is rotated by 180° and observed, the top and bottom are reversed. Further, in the following description, the case where the first conductivity type is the n type and the second conductivity type opposite thereto is the p type will be exemplified. However, the conductivity type may be selected in the opposite relationship, the first conductivity type may be the p type, and the second conductivity type may be the n type. Further, + and − attached to n and p mean that the impurity concentration is relatively high or low, respectively, as compared with the semiconductor regions to which + or − is not added. However, even if the semiconductor regions have the same n and n, it does not mean that the impurity concentrations of the respective semiconductor regions are exactly the same. The following structures of the embodiments and modifications thereof can be manufactured by conventional manufacturing techniques widely available and known in the field of insulated gate bipolar transistors.

First Embodiment

FIG. 1 is a plan view schematically showing trenches (7a, 7b) arranged in the active portion of an IGBT according to a first embodiment of the present invention. As shown in FIG. 1, the trenches (7a, 7b) are composed of striped gate trenches 7a and striped dummy trenches 7b arranged side by side on both sides of the gate trench 7a in a plan view. In FIG. 1, gate trenches 7a and dummy trenches 7b are alternately arranged side by side, but the present invention is not limited to this. For example, one or more dummy trenches 7b may be arranged side by side between adjacent two gate trenches 7a. The gate trench 7a has an upper gate conductive member 11a connected to a gate surface electrode 16 via a wiring layer 12a and a contact hole 13a. A bottom gate conductive member 9a divided from the upper gate conductive member 11a by a split insulating film 10a is provided at the tip of the gate trench 7a in the depth direction. The dummy trench 7b has an upper dummy conductive member 11b connected to an emitter surface electrode 15 via a wiring layer 12b and a contact hole 13b. A bottom dummy conductive member 9b divided from an upper dummy conductive member 11b by a split insulating film 10b is provided at the tip of the dummy trench 7b in the depth direction. The bottom gate conductive member 9a and the bottom dummy conductive member 9b are connected to the gate surface electrode 16 via a wiring layer 12c and a contact hole 13c. Although not shown, a gate pad electrically connected to an external gate drive circuit or the like may be arranged at the end of the active portion. Further, an outer peripheral portion having a high voltage withstand structure may be provided around the active portion.

Figure 2:
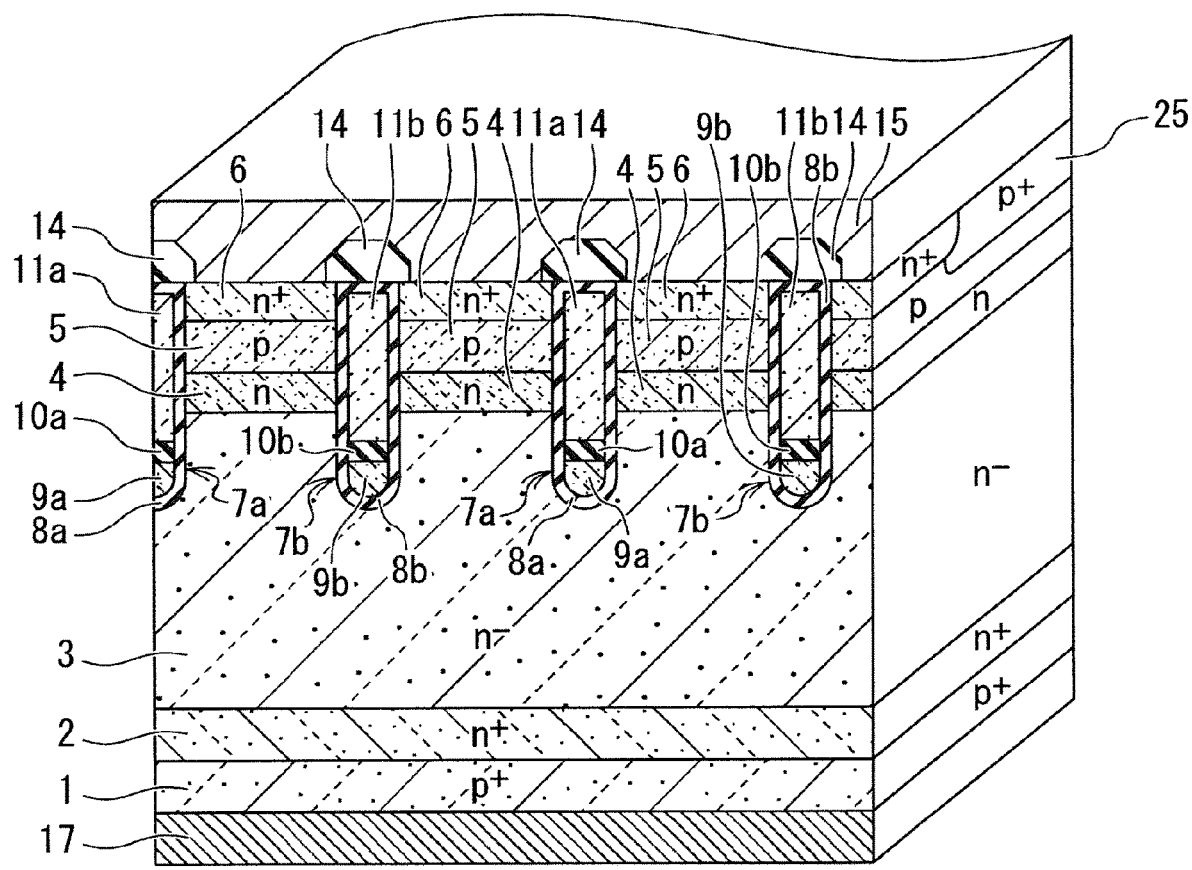
FIG. 2 is a schematic perspective view including a cross section seen from the direction of the line A-A in FIG. 1.

FIG. 2 is a view of a cross section cut in a direction orthogonal to the direction in which the trenches (7a, 7b) extend in parallel, as viewed from an oblique direction. As shown in FIG. 2, a second conductive type (p type) base region 5 is arranged on a first conductive type (n⁻ type) drift layer 3. An n⁺ type emitter region 6 having a higher impurity concentration than the drift layer 3 is provided above the base region 5. An n-type accumulation layer 4 having a higher impurity concentration than the drift layer 3 is provided below the base region 5. Trenches (7a, 7b) penetrating the base region 5 and the accumulation layer 4 from the upper surface of the emitter region 6 are provided. The side surface of each of the trenches (7a, 7b) is in contact with the emitter region 6, the base region 5, and the accumulation layer 4, and is further in contact with a part of the drift layer 3. The trenches (7a, 7b) penetrate the base region 5 and the accumulation layer 4 from the emitter region 6 to reach the drift layer 3. The dummy trench 7b is provided on both sides of the gate trench 7a so as to face the gate trench 7a with the emitter region 6, the base region 5, and the accumulation layer 4 interposed therebetween. A p⁺ type contact region 25 having a higher impurity concentration than the base region 5 is also provided above the base region 5. The contact region 25 is provided alternately with the emitter region 6 in the direction in which the trenches (7a, 7b) extend in parallel.

As shown in FIG. 2, a gate insulating film 8a is provided on the bottom surface and the side surface of the gate trench 7a. The split-type gate electrode (9a, 11a) is embedded inside the gate trench 7a via the gate insulating film 8a. The gate electrode (9a, 11a) is composed of the bottom gate conductive member 9a provided at the bottom of the gate trench 7a and the upper gate conductive member 11a provided on the bottom gate conductive member 9a via the split insulating film 10a. Further, a dummy insulating film 8b is provided on the bottom surface and the side surface of the dummy trench 7b. The split-type dummy electrode (9b, 11b) is embedded inside the dummy trench 7b via the dummy insulating film 8b. The dummy electrode (9b, 11b) is composed of the bottom dummy conductive member 9b provided at the bottom of the dummy trench 7b and the upper dummy conductive member 11b provided on the bottom dummy conductive member 9b via the split insulating film 10b. The lower surfaces of the upper gate conductive member 11a and the upper dummy conductive member 11b are located below the level of the lower surface of the base region 5. The upper surfaces of the bottom gate conductive member 9a and the bottom dummy conductive member 9b are located below the level of the upper surface of the drift layer 3.

As the gate insulating film 8a, in addition to a silicon dioxide ($SiO_2$) film, a single layer made of one of silicon oxynitride (SiON) film, strontium oxide (SrO) film, silicon nitride ($Si_3N_4$) film, aluminum oxide ($Al_2O_3$) film, magnesium oxide (MgO) film, yttrium oxide ($Y_2O_3$) film, hafnium oxide ($HfO_2$) film, zirconium oxide ($ZrO_2$) film, tantalum oxide ($Ta_2O_5$) film, and bismuth oxide ($Bi_2O_3$) film, or a composite film made of laminating these films may be adopted. As the split insulating films 10a and 10b, a tetraethoxysilane (TEOS) oxide film, a high resistance polysilicon film, or the like can be used. As the material of the gate electrode (9a, 11a) and the dummy electrode (9b, 11b), a polysilicon layer (doped polysilicon layer) in which impurities such as phosphorus (P) and boron (B) are added to a high impurity concentration, for example, can be used.

Interlayer insulating films 14 are arranged on the upper gate conductive member 11a and the upper dummy conductive member 11b, respectively. The emitter surface electrode 15 is provided so as to cover the interlayer insulating film 14. The emitter surface electrode 15 physically contacts the exposed emitter region 6 between the interlayer insulating films 14. As the interlayer insulating film 14, a silicon oxide film to which boron (B) and phosphorus (P) are added (BPSG) is used. The interlayer insulating film 14 may be a silicon oxide film to which phosphorus (P) is added (PSG), a non-doped $SiO_2$ film called "NSG" that does not contain phosphorus (P) or boron (B), a silicon oxide film to which boron (B) is added (BSG), $Si_3N_4$ film, or the like instead. Further, a laminated film of these materials may be used. The emitter surface electrode 15 can be composed of, for example, a nickel silicide ($NiSi_x$) film, a titanium nitride (TiN) film, a titanium (Ti) film, an aluminum (Al) film, or an aluminum-silicon (Al—Si) film.

An $n^+$ type field stop layer (FS layer) 2 is arranged on the lower surface of the drift layer 3, and a $p^+$ type collector region 1 is arranged on the lower surface of the FS layer 2. A collector back surface electrode 17 is arranged on the lower surface of the collector region 1. As the collector back surface electrode 17, for example, a single-layer film made of gold (Au) or a metal film laminated in the order of Ti, nickel (Ni), and Au can be used.

Figure 3:
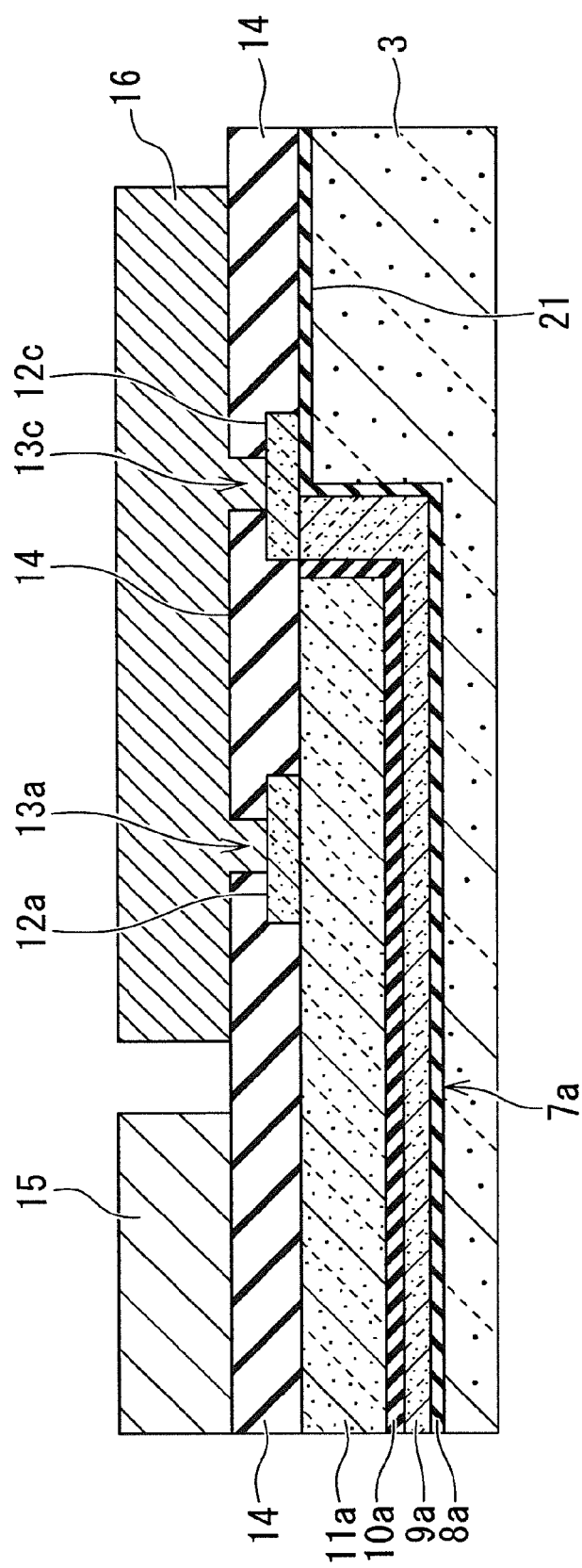
FIG. 3 is a schematic cross-sectional view seen from the direction of the line B-B in FIG. 1.
Figure 4:
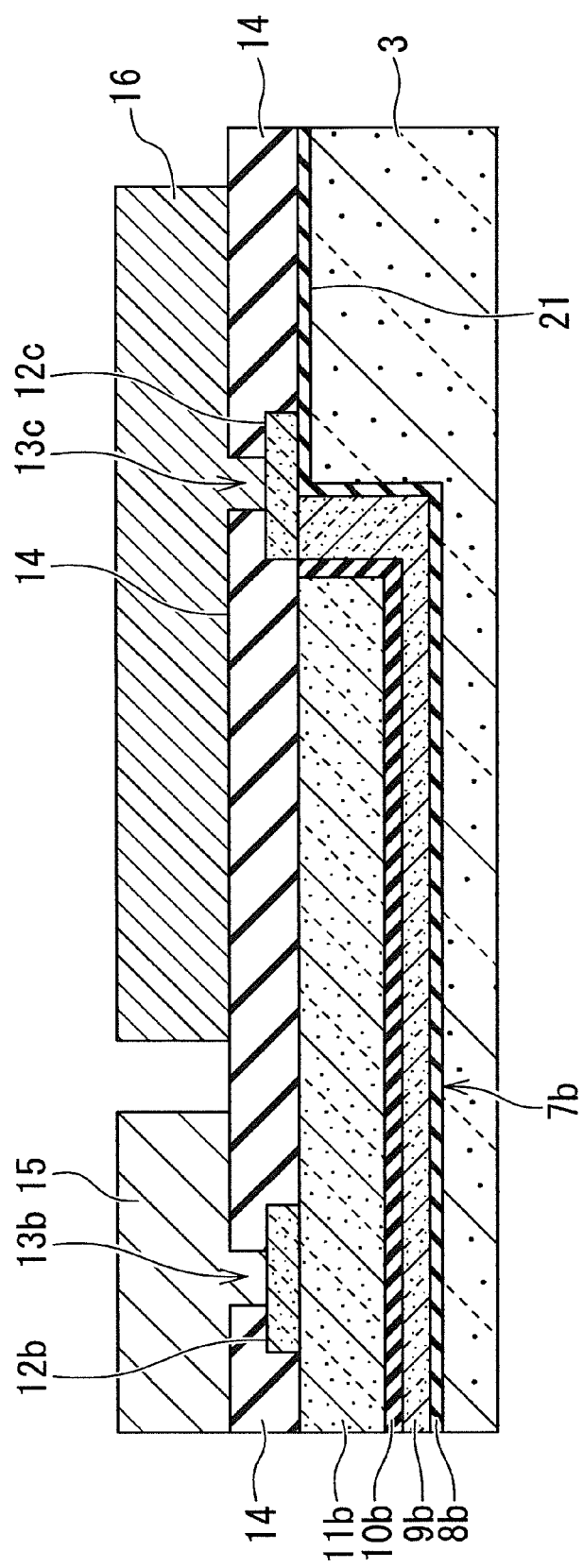
FIG. 4 is a schematic cross-sectional view seen from the direction of the line C-C in FIG. 1.

FIGS. 3 and 4 are diagrams schematically showing cross sections of the gate trench 7a and the dummy trench 7b cut in the extending direction, respectively. In FIGS. 3 and 4, the emitter region 6, the contact region 25, the base region 5, and the accumulation layer 4 do not appear in these cross sections. As shown in FIG. 3, the upper gate conductive member 11a and the bottom gate conductive member 9a are insulated by the split insulating film 10a. A wiring layer 12a is provided on the upper surface of the upper gate conductive member 11a. A wiring layer 12c is provided on the upper surface of the bottom gate conductive member 9a exposed at one end of the gate trench 7a in the stretching direction and on the field insulating film 21 provided on the drift layer 3. The wiring layers 12a and 12c are connected to the gate surface electrode 16, which is electrically connected to the gate potential, via the contact holes 13a and 13c, respectively. Further, as shown in FIG. 4, the upper dummy conductive member 11b and the bottom dummy conductive member 9b are insulated by the split insulating film 10b. A wiring layer 12b is provided on the upper surface of the upper dummy conductive member 11b. A wiring layer 12c is provided on the upper surface of the bottom dummy conductive member 9b exposed at one end of the dummy trench 7b in the stretching direction and on the field insulating film 21 on the drift layer 3. The wiring layer 12b is connected to the emitter surface electrode 15, which is electrically connected to the emitter potential, via the contact hole 13b. The wiring layer 12c is connected to the gate surface electrode 16, which is electrically connected to the gate potential, via the contact hole 13c.

During the operation of the IGBT of the first embodiment, for example, a positive voltage is applied to the collector back electrode 17 with the emitter front electrode 15 being at the ground potential. When a positive voltage equal to or higher than the threshold value is applied to the gate electrodes (9a, 11a), an inversion layer (channel) is formed on the side surface of the gate trench 7a in the base region 5, and the IGBT turns on. The inversion layer is formed on the surface of the base region 5 in contact with the side surface of the gate trench 7a, which is the interface between the gate insulating film 8a sandwiched at the position where the base region 5 faces the upper gate conductive member 11a and the base region 5. In the on state, a current flows from the collector back surface electrode 17 to the emitter surface electrode 15 via the collector region 1, the FS layer 2, the drift layer 3, the accumulation layer 4, the inversion layer in the base region 5, and the emitter region 6. When the voltage applied to the gate electrodes (9a, 11a) is less than the threshold value, no current flows from the collector back surface electrode 17 to the emitter front surface electrode 15 because the inversion layer is not formed in the base region 5.

In the IGBT according to the first embodiment, since the upper dummy conductive member 11b of the dummy trench 7b is electrically connected to the emitter potential, an inversion layer is not formed on the surface of the base region 5 in contact with the side surface of the dummy trench 7b. Therefore, it is possible to reduce the density of the gate trenches 7a in which the channel of the IGBT is formed, and it is possible to suppress an increase in the total gate charge Qg. Further, a split-type electrode structure is embedded in each of the trenches (7a, 7b). Both the bottom gate conductive member 9a of the gate trench 7a and the bottom dummy conductive member 9b of the dummy trench 7b are electrically connected to the gate potential. Therefore, it is possible to easily perform an insulation withstand voltage inspection screening on the gate insulating film 8a and the dummy insulating film 8b provided on the bottom surface of the trench (7a, 7b) where electric field concentration is likely to occur.

Figure 5:
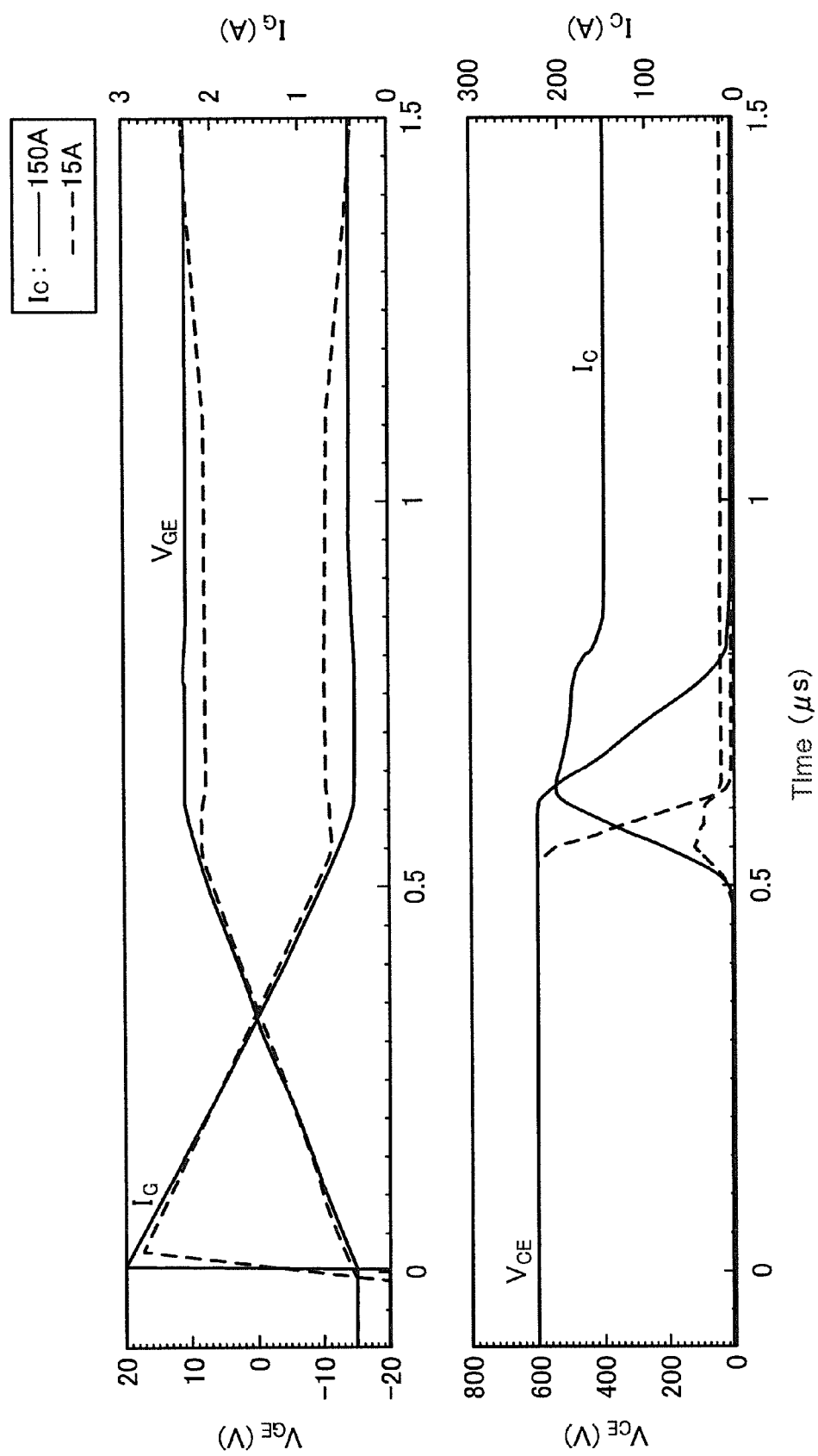
FIG. 5 is a diagram showing an example of simulated turn-on waveforms of the IGBT of the first embodiment.
Figure 6:
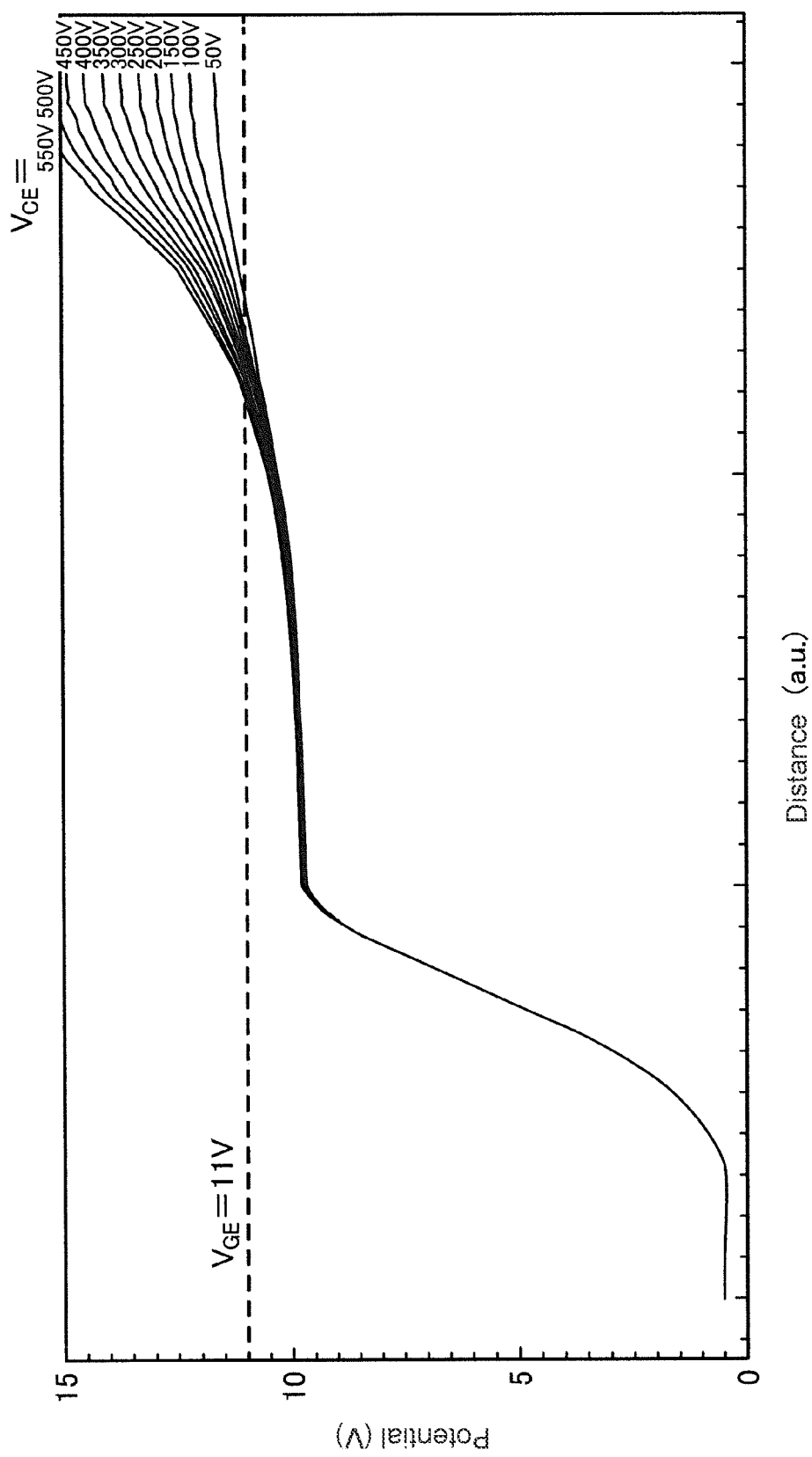
FIG. 6 is a diagram showing an example of a simulated potential distribution around a gate trench during turn-on of the IGBT of the first embodiment.

The turn-on characteristics of the IGBT sample of the first embodiment were evaluated. FIG. 5 show simulated turn-on waveforms of the sample. As shown in FIG. 5, when the gate voltage $V_{GE}$ between the gate and the emitter is applied to activate the IGBT sample, the gate current $I_G$ first flows, the capacitance between the gate and the emitter is charged, and the $V_{GE}$ rises. When the $V_{GE}$ becomes equal to or higher than the threshold voltage, the collector voltage $V_{CE}$ between the collector and the emitter drops, and the collector current $I_C$ starts to flow. When the collector current $I_C$ has a low current of 15 A, the time change rate dv/dt of the collector voltage $V_{CE}$ is almost constant and smoothly decreases. Even when the collector current $I_C$ is 150 A, the time change rate dv/dt of the collector voltage $V_{CE}$ is almost constant. FIG. 6 shows simulated potential distributions with respect to the distance in the depth direction from the upper surface of the emitter region 6 to the bottom of the gate trench 7a around the gate trench 7a when the collector voltage $V_{CE}$ decreases at intervals of 50 V. As shown in FIG. 6, the potential rises from the junction region between the emitter region 6 and the base region 5 and becomes substantially flat in the accumulation layer 4, and increases near the bottom of the gate trench 7a in the drift layer 3. When the collector voltage $V_{CE}$ decreases, the potential near the bottom of the gate trench 7a decreases, but it does not become lower than the gate voltage $V_{GE}$. Further, no significant change was observed in the potentials around the emitter region 6, the base region 5, and the accumulation layer 4, and the potentials there were almost fixed.

Figure 7:
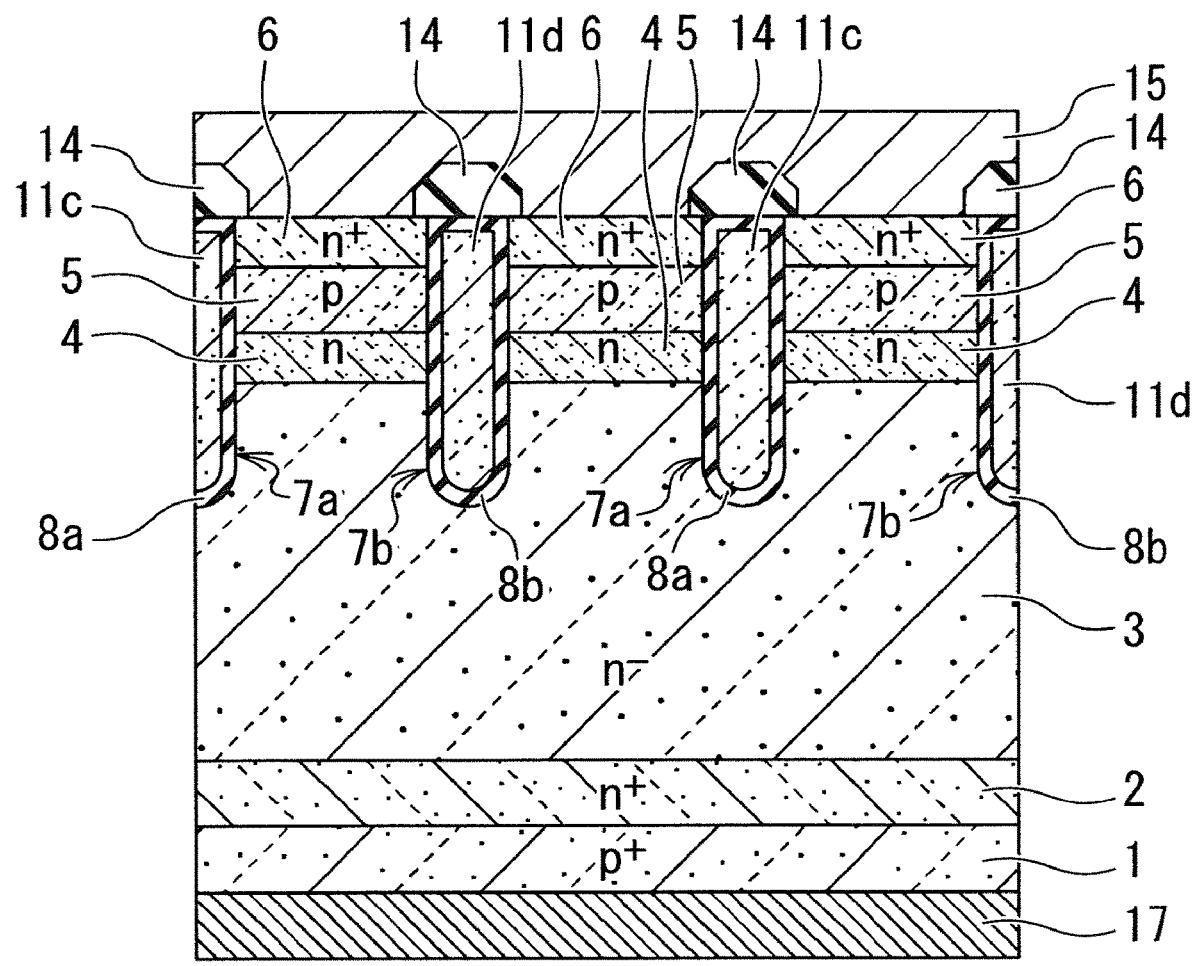
FIG. 7 is a schematic cross-sectional view showing an example of an IGBT according to a comparative example.
Figure 8:
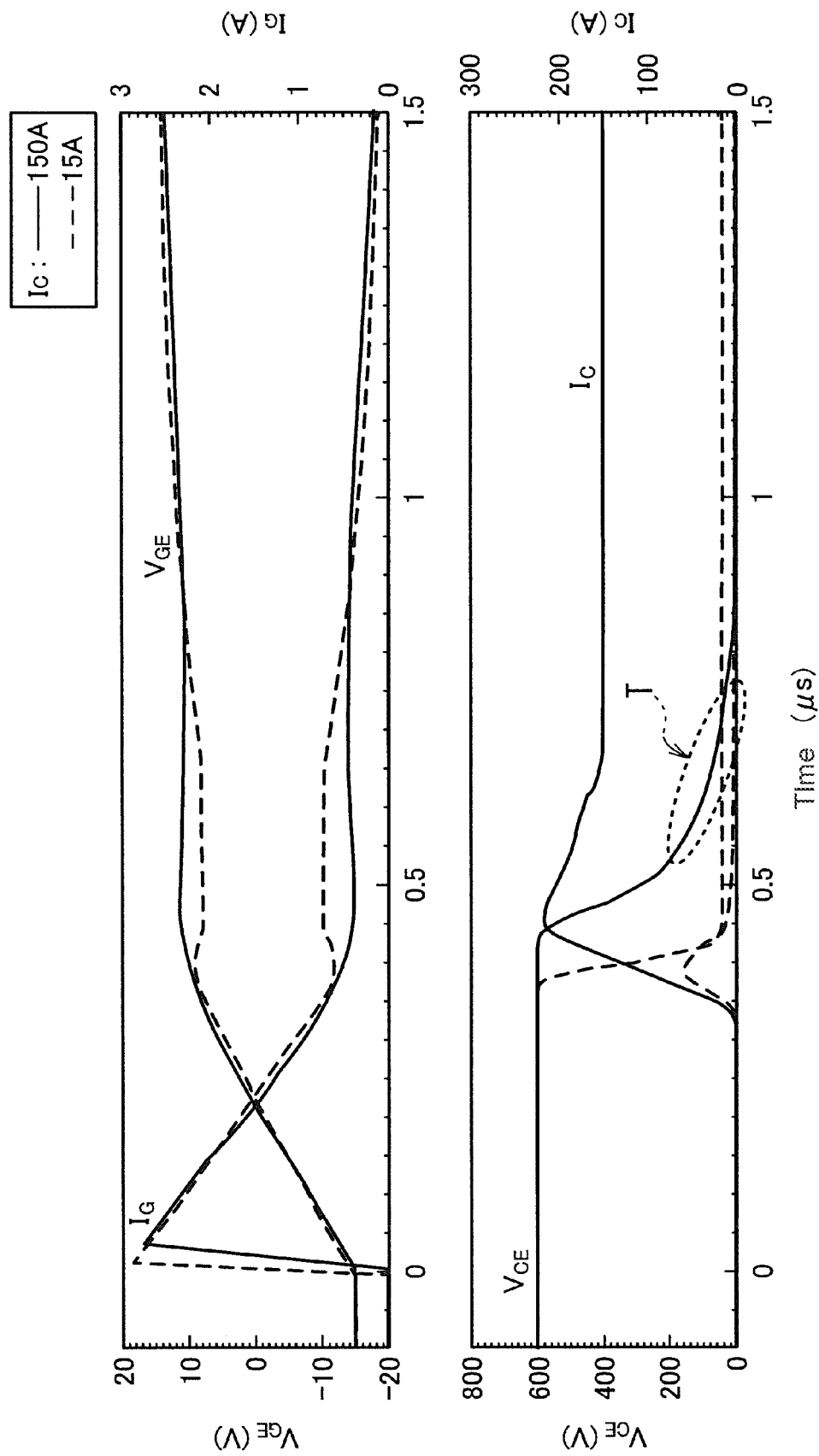
FIG. 8 is a diagram showing an example of simulated turn-on waveforms of an IGBT of the comparative example.

FIG. 7 shows, as a comparative example, a conventional IGBT having a trench (7a, 7b) in which a unitary electrode structure is embedded. As shown in FIG. 7, a unitary gate electrode 11c is provided inside the gate trench 7a via a gate insulating film 8a, and a unitary dummy electrode 11d is provided inside the dummy trench 7b via a dummy insulating film 8b. FIG. 8 shows simulated turn-on waveforms of the comparative example. As shown in FIG. 8, when the IGBT of the comparative example is activated and the gate voltage $V_{GE}$ becomes equal to or higher than the threshold voltage, the collector voltage $V_{CE}$ drops and the collector current $I_C$ starts to flow. When the $I_C$ has a low current of 15 A, the time change rate dv/dt of the collector voltage $V_{CE}$ is almost constant and smoothly decreases even in the comparative example. On the other hand, when the $I_C$ is 150 A, the time change rate dv/dt of the collector voltage $V_{CE}$ is not constant in the comparative example, and a voltage tail T is generated. The cause of the voltage tail T is that the gate-collector capacitance $C_{GC}$ increases transiently. As shown in FIG. 8, since the collector current $I_C$ having a high collector current flows during the period of the voltage tail T, the turn-on loss increases.

Figure 9:
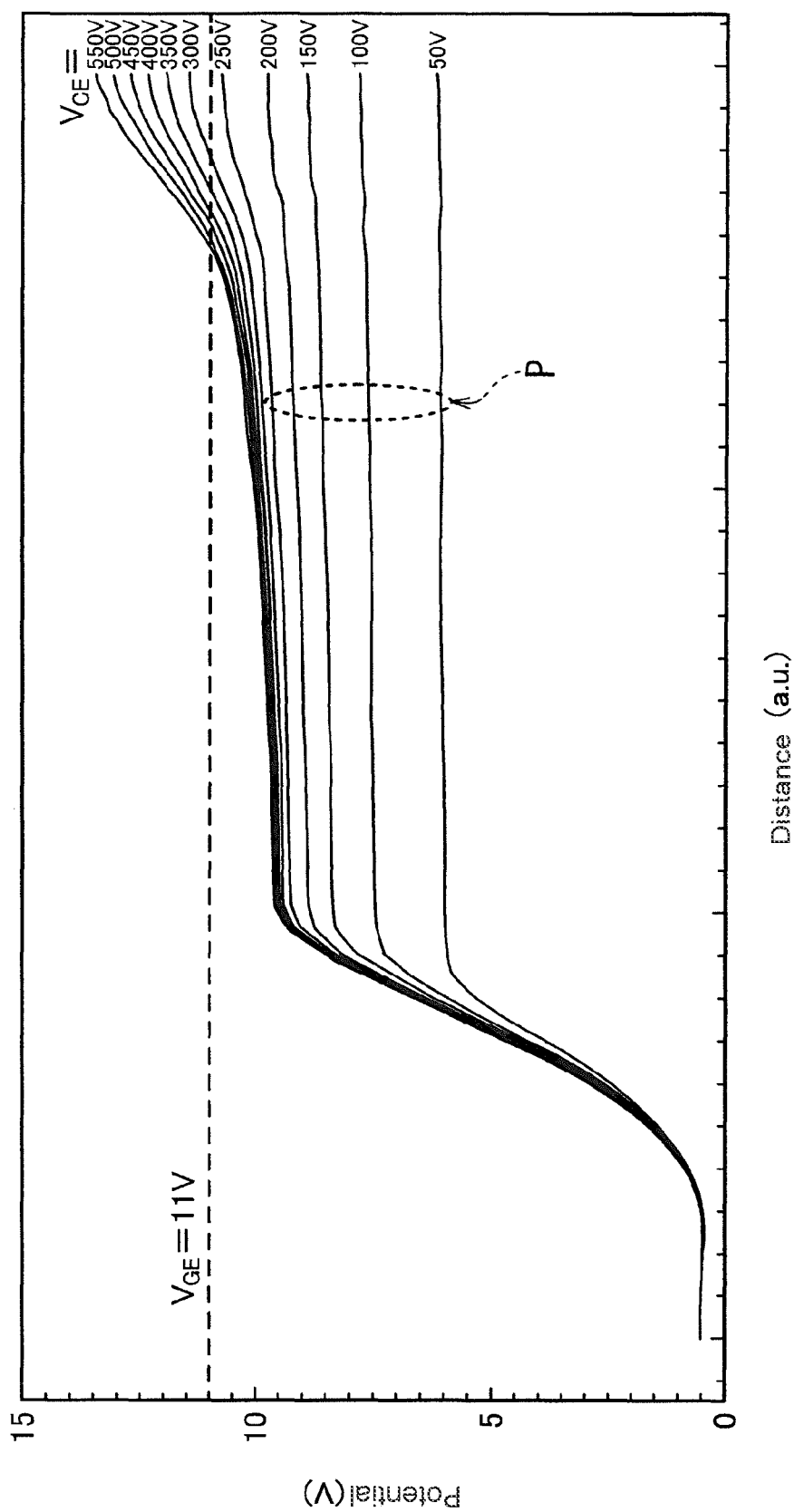
FIG. 9 is a diagram showing an example of simulated potential distribution around a gate trench during the turn-on of the IGBT of the comparative example.

FIG. 9 shows simulated potential distributions around the gate trench 7a when the collector voltage $V_{CE}$ decreases at intervals of 50 V. As shown in FIG. 9, the potential distribution of the comparative example also increases near the bottom of the gate trench 7a in the same manner as the potential distribution of the example shown in FIG. 6, but the potential value is lower than that of the embodiment example. In the comparative example, the dummy electrode 11d of the dummy trench 7b arranged next to the gate trench 7a is connected to the emitter potential, and this pushes down the potential near the bottom of the gate trench 7a. Further, as shown in FIG. 9, when the collector voltage $V_{CE}$ drops from 550V to 300V, mainly the potential near the bottom of the gate trench 7a drops, but it does not become lower than the gate voltage $V_{GE}$. In FIG. 9, when the $V_{CE}$ is in the range P of 250 V to 50 V, as the $V_{CE}$ descends, the potential near the bottom of the gate trench 7a becomes lower than that of the $V_{GE}$, and further, the potential drop also occurs in the n-type semiconductor region from the drift layer 3 to the accumulation layer 4. Such a large decrease in potential in the n-type semiconductor region corresponds to an increase in the gate-collector capacitance $C_{GC}$. That is, as shown in FIG. 8, since the gate-collector capacitance $C_{GC}$ is charged with a substantially constant gate current $I_G$, the time required for charging increases and the voltage tail T is generated.

As described above, in the first embodiment, the trenches (7a, 7b) are each embedded with a split-type electrode structure. Both the upper gate conductive member 11a and the bottom gate conductive member 9a of the gate trench 7a are electrically connected to the gate potential. The upper dummy conductive member 11b of the dummy trench 7b is electrically connected to the emitter potential, while the bottom dummy conductive member 9b is electrically connected to the gate potential. Therefore, as the collector voltage $V_{CE}$ decreases, the potential at the bottom of the gate trench 7a also decreases, but the potential near the bottom of the gate trench 7a is raised higher than the gate voltage $V_GE$. As a result, it is possible to suppress a decrease in potential in the n-type semiconductor region from the drift layer 3 to the accumulation layer 4, and it is possible to prevent the generation of the voltage tail T in the collector voltage $V_{CE}$. Thus, in the IGBT according to the first embodiment, the turn-on loss can be reduced and a screening on the gate insulating film can be performed with ease.

(First Modification)

Figure 10:
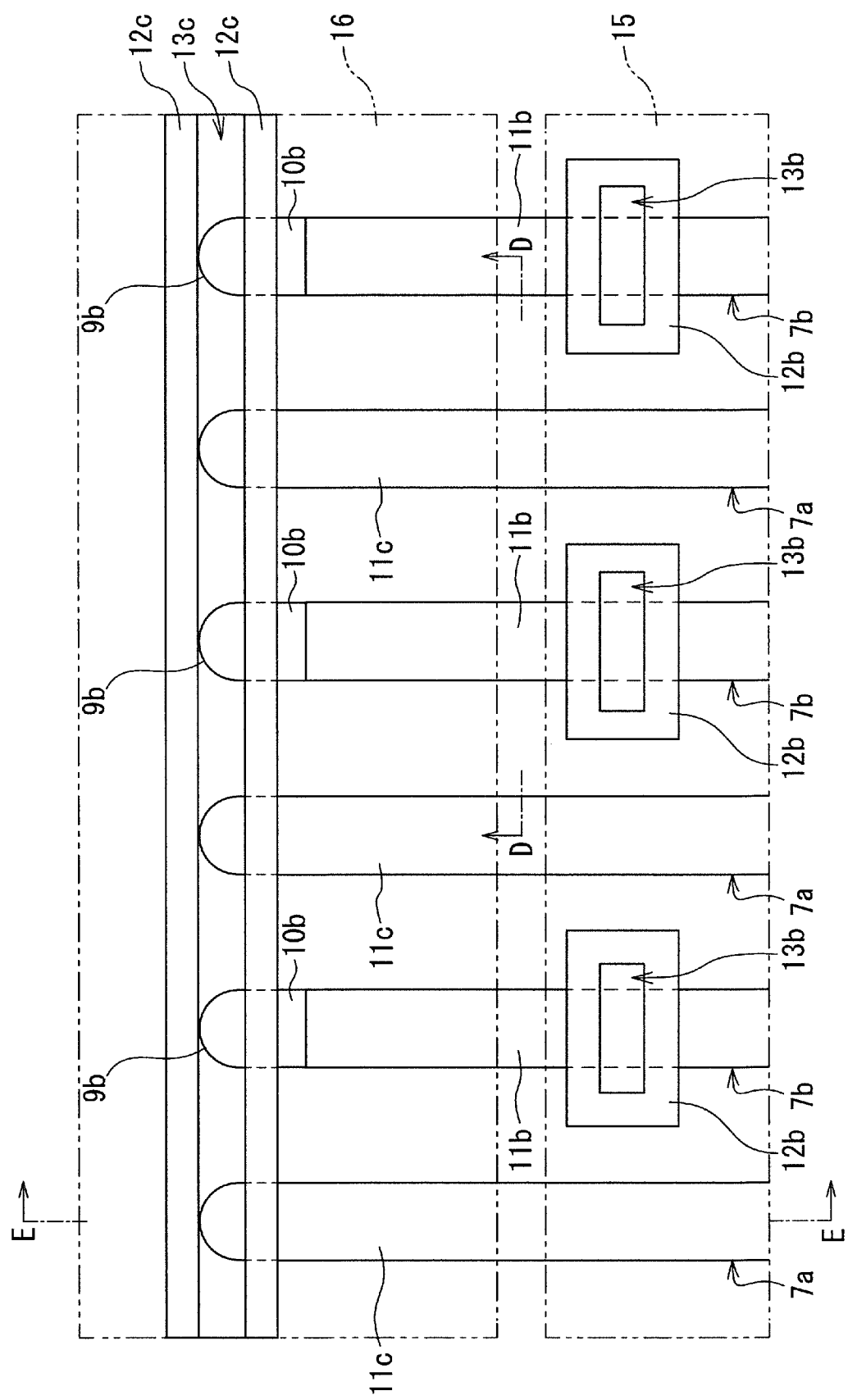
FIG. 10 is a schematic plan view showing an example of an IGBT according to a first modification of the first embodiment.
Figure 11:
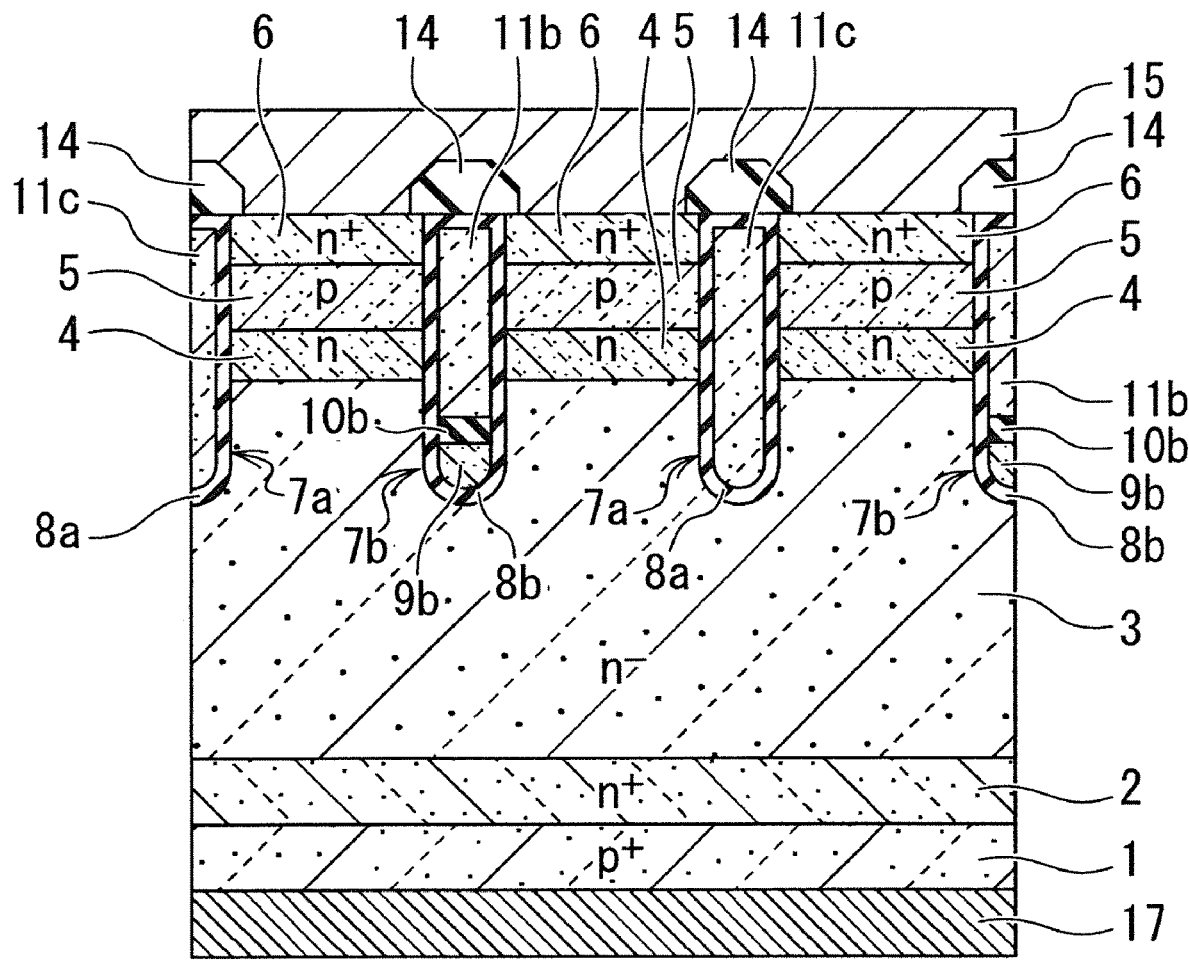
FIG. 11 is a schematic cross-sectional view seen from the direction of the line D-D in FIG. 10.

As shown in FIG. 10, the IGBT according to a first modification of the first embodiment of the present invention includes striped trenches (7a, 7b) arranged side by side in a plan view. The gate trench 7a has a unitary gate electrode 11c connected to the gate surface electrode 16 via a wiring layer 12c and a contact hole 13c. The dummy trench 7b has the upper dummy conductive member 11b and the bottom dummy conductive member 9b divided by the split insulating film 10b. The upper dummy conductive member 11b is connected to the emitter surface electrode 15 via the wiring layer 12b and the contact hole 13b. The bottom dummy conductive member 9b is connected to the gate surface electrode 16 via the wiring layer 12c and the contact hole 13c, as in the first embodiment. As shown in FIG. 11, the trench (7a, 7b) penetrates the base region 5 and the accumulation layer 4 from the emitter region 6 and reaches the drift layer 3. The gate electrode 11c is embedded inside the gate trench 7a via a gate insulating film 8a. The split-type dummy electrodes (9b, 11b) are embedded inside the dummy trench 7b via the dummy insulating film 8b. The interlayer insulating films 14 are arranged on the gate electrode 11c and the upper dummy conductive member 11b, respectively. The first modification is different from the first embodiment in that the unitary gate electrode 11c is embedded in the gate trench 7a. Since the other configurations of the IGBT of the first modification are the same as those of the first embodiment, duplicated description will be omitted.

Figure 12:
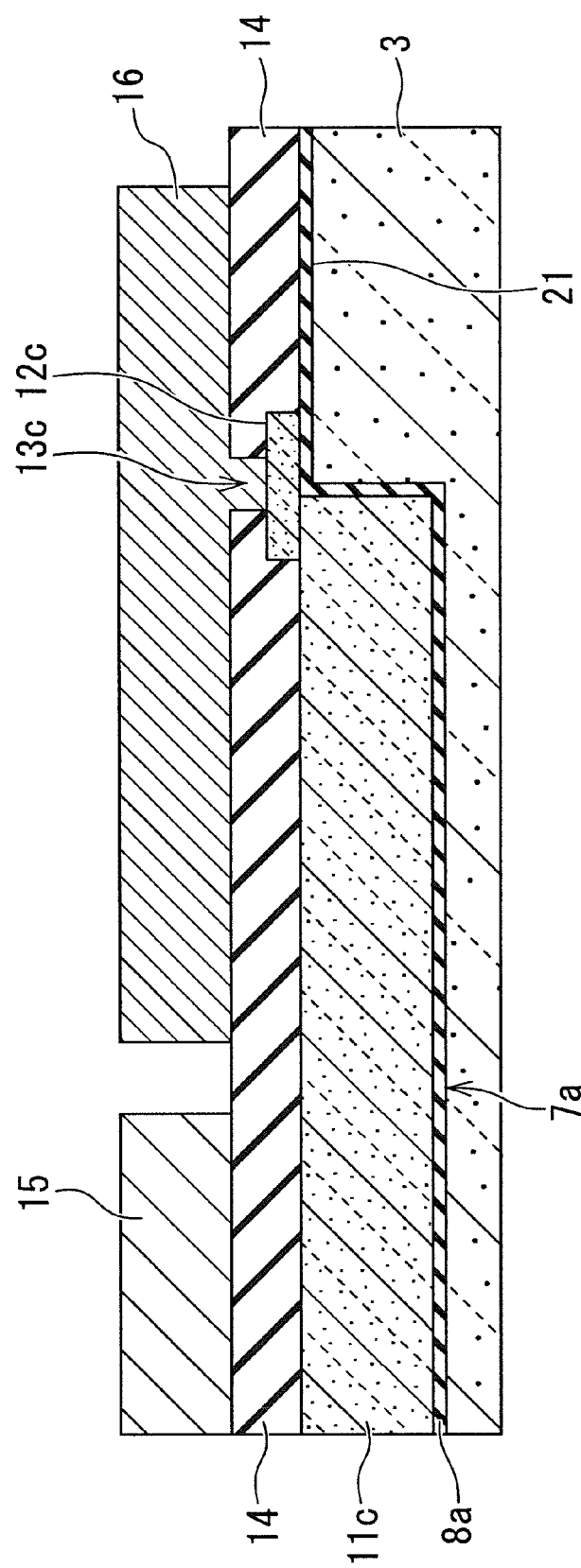
FIG. 12 is a schematic cross-sectional view seen from the direction of the line E-E in FIG. 10.

As shown in FIG. 12, at one end of the gate trench 7a in the extending direction, the wiring layer 12c is provided in physical contact with the gate electrode 11c and the upper surface of the field insulating film 21. The gate electrode 11c is connected to the gate surface electrode 16 electrically connected to the gate potential via the wiring layer 12c and the contact hole 13c. The gate electrode 11c embedded in the gate trench 7a is a unitary type, which simplifies the manufacturing process of the gate electrode structure. As a result, potential manufacturing damages to the gate insulating film 8a can be reduced.

Further, as shown in FIG. 4, the bottom dummy conductive member 9b embedded in the inner bottom of the dummy trench 7b is connected the gate surface electrode 16, which is electrically connected to the gate potential, via the wiring layer 12c and the contact hole 13c. Therefore, it is possible to easily perform an insulation withstand voltage inspection screening on the gate insulating film 8a and the dummy insulating film 8b provided on the bottom surface of the trench (7a, 7b) where electric field concentration is likely to occur.

Further, in the IGBT according to the first modification, the upper dummy conductive member 11b of the dummy trench 7b is electrically connected to the emitter potential as in the IGBT of the first embodiment shown in FIG. 4. Therefore, the inversion layer is not formed on the surface of the base region 5 in contact with the side surface of the dummy trench 7b. Therefore, the density of the gate trenches 7a on which the IGBT channel is formed is reduced, and it is possible to suppress an increase in the total gate charge Qg.

Further, although the upper dummy conductive member 11b of the dummy trench 7b is electrically connected to the emitter potential, the bottom dummy conductive member 9b is electrically connected to the gate potential. Therefore, even if the collector voltage $V_{CE}$ decreases, the potential near the bottom of the gate trench 7a is raised higher than the gate voltage $V_{GE}$. As a result, it is possible to suppress a decrease in potential in the n-type semiconductor region from the drift layer 3 to the accumulation layer 4, and it is possible to prevent the generation of a voltage tail in the collector voltage $V_{CE}$. Thus, the turn-on loss can be reduced also in the IGBT of the first modification.

(Second Modification)

Figure 13:
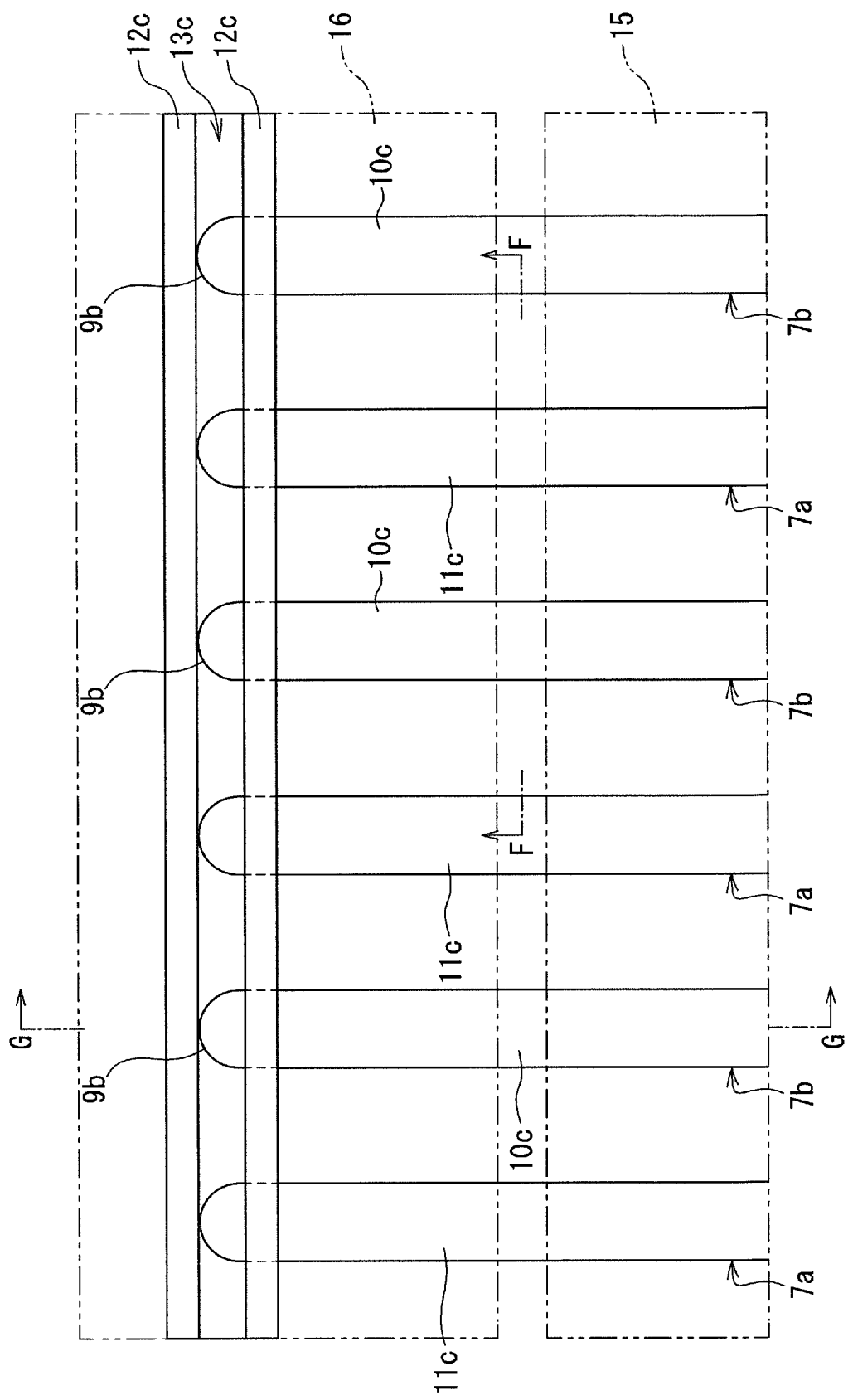
FIG. 13 is a schematic plan view showing an example of an IGBT according to a second modification of the first embodiment.
Figure 14:
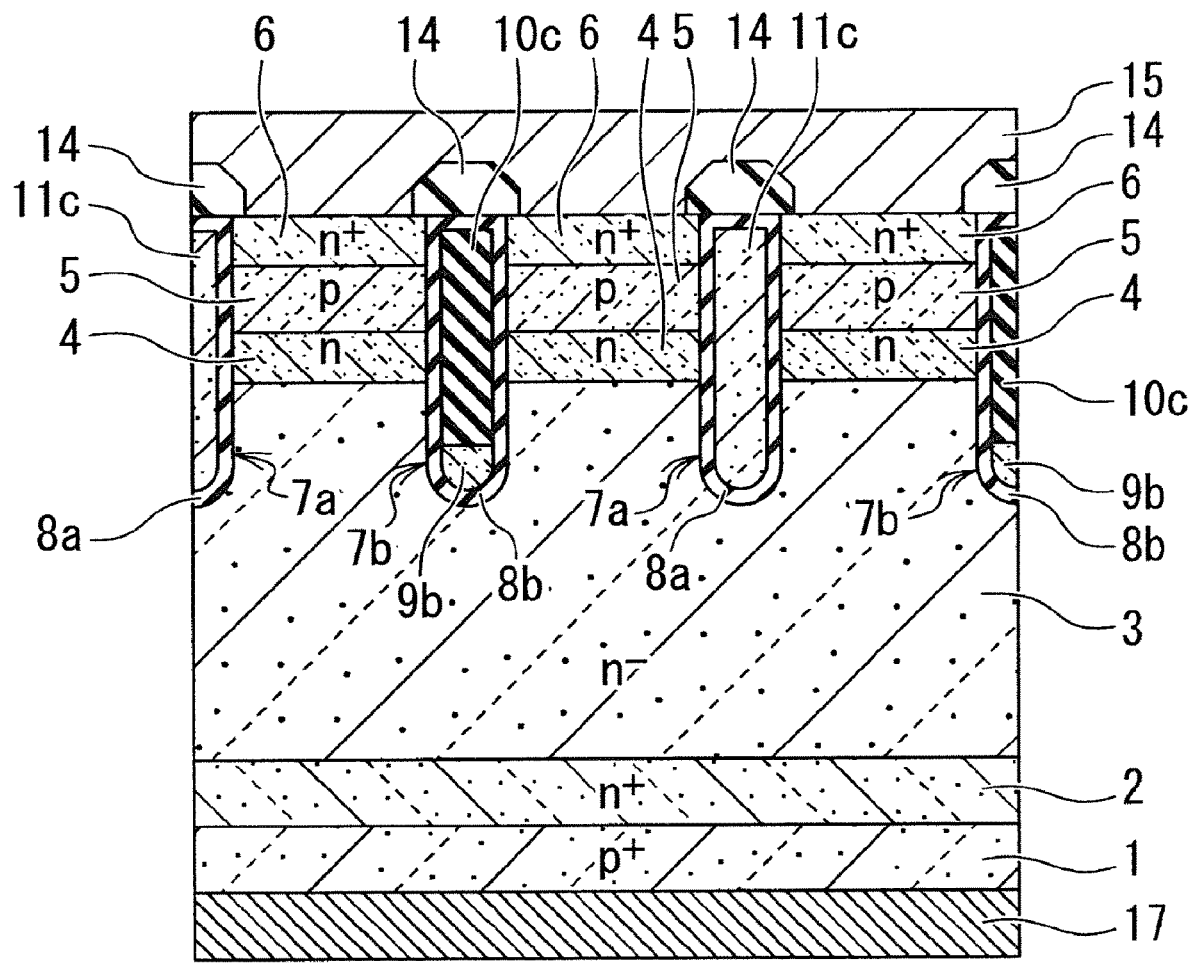
FIG. 14 is a schematic cross-sectional view seen from the direction of the line F-F in FIG. 13.

As shown in FIG. 13, the IGBT according to a second modification of the first embodiment of the present invention includes striped trenches (7a, 7b) arranged side by side in a plan view. The gate electrode 11c of the gate trench 7a is connected to the gate surface electrode 16 via the wiring layer 12c and the contact hole 13c. The dummy trench 7b has an upper embedded insulating film 10c and a bottom dummy conductive member 9b. The bottom dummy conductive member 9b is connected to the gate surface electrode 16 via the wiring layer 12c and the contact hole 13c. As shown in FIG. 14, the trench (7a, 7b) penetrates the base region 5 and the accumulation layer 4 from the emitter region 6 and reaches the drift layer 3. A unitary gate electrode 11c is embedded inside the gate trench 7a via a gate insulating film 8a. Inside the dummy trench 7b, the upper embedded insulating film 10c is embedded in the upper part and the bottom dummy conductive member 9b is embedded under the upper embedded insulating film 10c via the dummy insulating film 8b. The lower surface of the upper embedded insulating film 10c is located below the level of the lower surface of the base region 5. As the upper embedded insulating film 10c, a TEOS oxide film, a high resistance polysilicon film, or the like can be used. The interlayer insulating films 14 are arranged on the gate electrode 11c and the upper embedded insulating film 10c, respectively. The second modification is different from the first modification in that the upper embedded insulating film 10c and the bottom dummy conductive member 9b are embedded in the dummy trench 7b. Since the other configurations of the IGBT of the second modification are the same as those of the first modification, duplicate description will be omitted.

Figure 15:
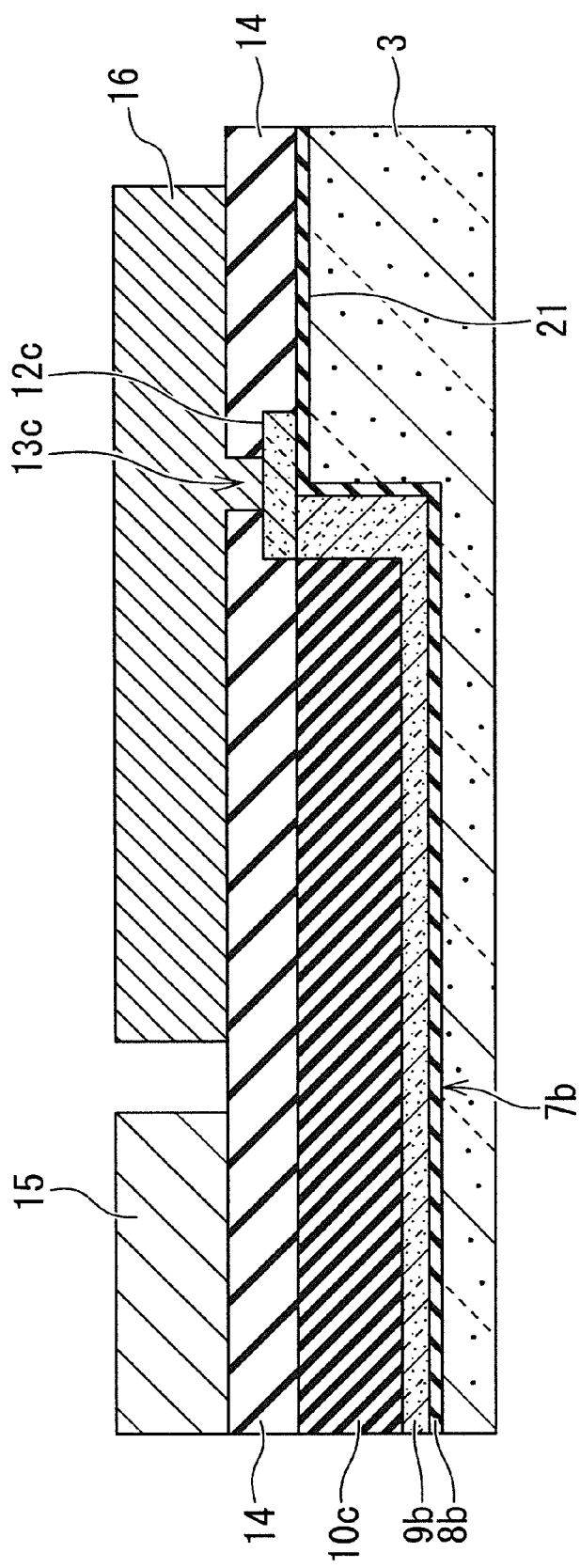
FIG. 15 is a schematic cross-sectional view seen from the direction of the line G-G in FIG. 13.

As shown in FIG. 15, at one end of the dummy trench 7b in the extending direction, the wiring layer 12c is provided in physical contact with the bottom dummy conductive member 9b and the upper surface of the field insulating film 21. The bottom dummy conductive member 9b is connected to the gate surface electrode 16, which is electrically connected to the gate potential, via the wiring layer 12c and the contact hole 13c. The gate trench 7a is the same as that of the first modification shown in FIG. 12, and the embedded unitary gate electrode 11c is electrically connected to the gate potential. Therefore, the manufacturing process of the gate electrode structure is simplified, and potential manufacturing damage to the gate insulating film 8a can be reduced. Further, it becomes possible to easily perform an insulation withstand voltage inspection screening on the gate insulating film 8a and the dummy insulating film 8b provided on the bottom surface of the trench (7a, 7b) where electric field concentration is likely to occur.

Further, in the IGBT according to the second modification, the upper embedded insulating film 10c of the dummy trench 7b has a floating potential. Therefore, the inversion layer is not formed on the surface of the base region 5 in contact with the side surface of the dummy trench 7b. Therefore, the density of the gate trenches 7a on which the IGBT channel is formed is reduced, and it is possible to suppress an increase in the total gate charge Qg. Further, the bottom dummy conductive member 9b is electrically connected to the gate potential. Therefore, even if the collector voltage $V_{CE}$ decreases, the potential near the bottom of the gate trench 7a is raised higher than the gate voltage $V_{GE}$. As a result, it is possible to suppress a decrease in potential in the n-type semiconductor region from the drift layer 3 to the accumulation layer 4, and it is possible to prevent the generation of a voltage tail in the collector voltage $V_{CE}$. Thus, the turn-on loss can be reduced also in the IGBT of the second modification.

Second Embodiment

Figure 16:
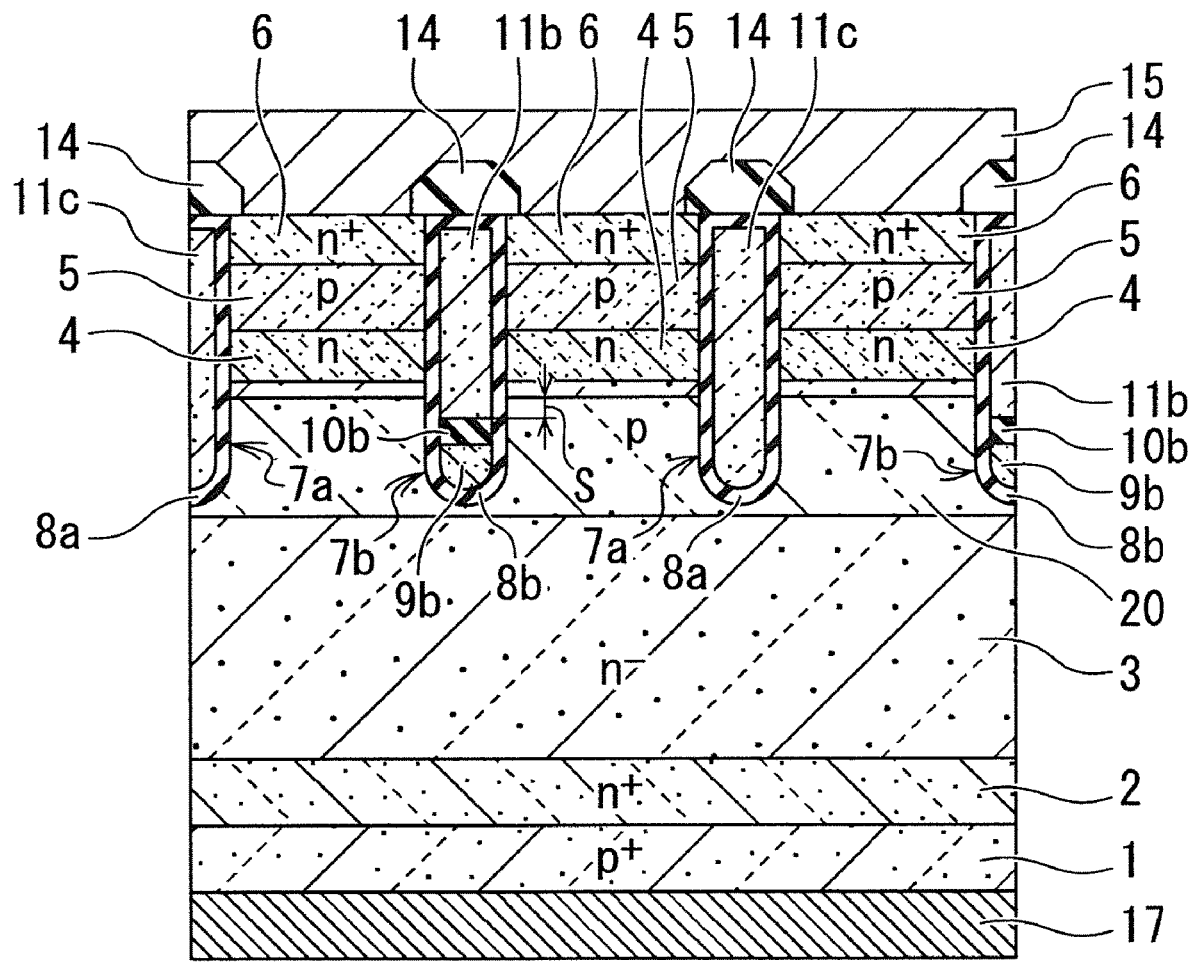
FIG. 16 is a schematic cross-sectional view showing an example of an IGBT according to a second embodiment.

As shown in FIG. 16, the IGBT according to a second embodiment of the present invention includes trenches (7a, 7b) arranged side by side, similarly to the first modification of the first embodiment. The gate electrode 11c is embedded inside the gate trench 7a via the gate insulating film 8a, and the split-type dummy electrodes (9b, 11b) are embedded inside the dummy trench 7b via the dummy insulating film 8b. In the second embodiment, as shown in FIG. 16, a p-type trench bottom floating layer 20 is provided above the n-type drift layer 3. The trenches (7a, 7b) penetrate the base region 5 and the accumulation layer 4 from the emitter region 6 and reach the trench bottom floating layer 20. The upper surface of the trench bottom floating layer 20 is located above the level of the lower surface of the upper dummy conductive member 11b of the dummy trench 7b by a distance S. That is, the trench bottom floating layer 20 and the upper dummy conductive member 11b overlap each other by the distance S. Here, instead of the unitary gate electrode 11c, the split-type gate electrodes (9a, 11a) shown in FIGS. 2 and 3 may be embedded in the gate trench 7a. The second embodiment is different from the first modification of the first embodiment in that the trench bottom floating layer 20 is provided on the upper part of the drift layer 3. Since the other configurations of the IGBT of the second embodiment are the same as those of the first modification of the first embodiment, duplicate description will be omitted.

Without the p-type trench bottom floating layer, as shown in FIG. 5, the time change rate dv/dt of the collector voltage $V_{CE}$ at turn-on becomes slower as the collector current $I_C$ becomes larger. In order to suppress the generation of noise, it is necessary to suppress the time change rate dv/dt. If the time change rate dv/dt when the collector current $I_C$ is small is regulated to a specified value, the time change rate dv/dt is suppressed further when the collector current $I_C$ is large, and the turn-on loss increases. In the second embodiment, the p-type trench bottom floating layer 20 that overlaps the upper dummy conductive member 11b of the dummy trench 7b by the distance S is provided. At the time of turn-on, holes are accumulated around the upper dummy conductive member 11b electrically connected to the emitter potential, and the trench bottom floating layer 20 is electrically connected to the emitter potential via the accumulated holes. As a result, the gate-collector capacitance $C_{GC}$ becomes constant, and the dependence of the time change rate dv/dt on the collector current $I_C$ is suppressed.

As described above, according to the IGBT of the second embodiment, it is possible to reduce the collector current $I_C$ dependence of the time change rate dv/dt of the collector voltage $V_{CE}$ at the time of turn-on, and it is possible to further suppress an increase in turn-on loss. The other effects of the IGBT of the second embodiment are the same as those of the IGBT of the first modification of the first embodiment. In the second embodiment, as described above, the unitary gate electrode 11c is used as the electrode structure embedded in the gate trench 7a, but the present invention is not limited to this. For example, as the electrode structure to be embedded in the gate trench 7a, the split-type gate electrodes (9a, 11a) shown in FIG. 2 may be used.

Third Embodiment

Figure 17:
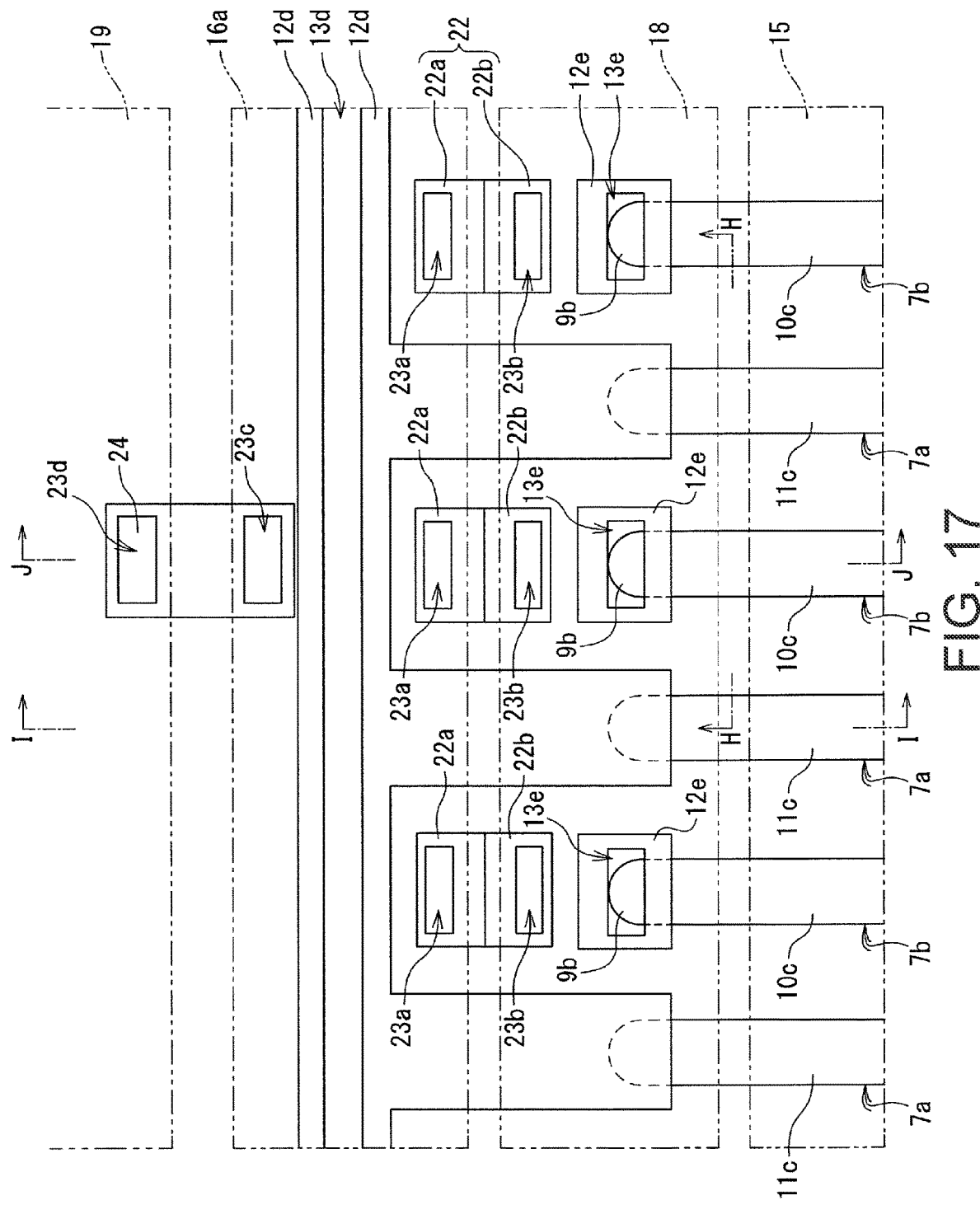
FIG. 17 is a schematic plan view showing an example of an IGBT according to a third embodiment.
Figure 18:
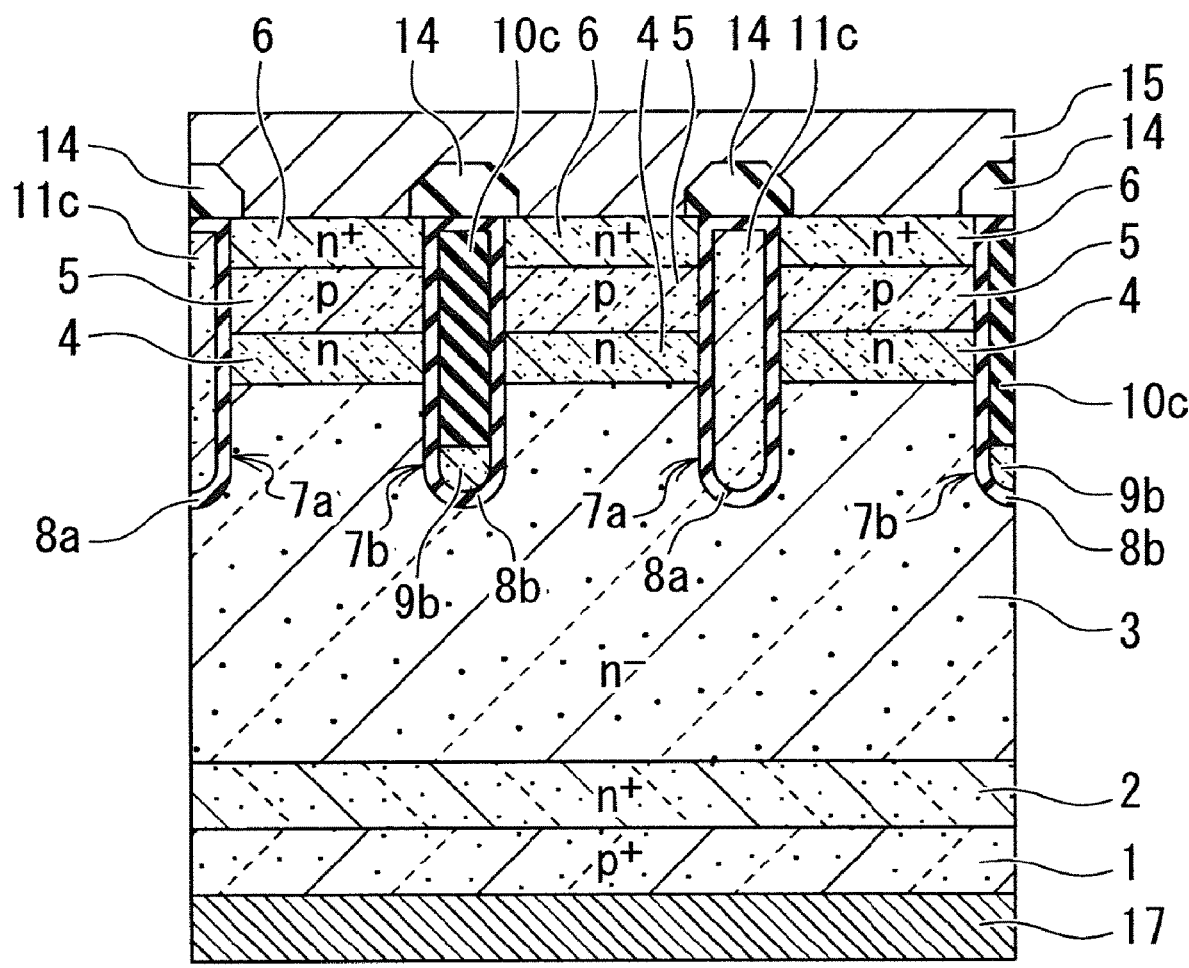
FIG. 18 is a schematic cross-sectional view seen from the direction of the line H-H in FIG. 17.

In the IGBT according to a third embodiment of the present invention, as shown in FIG. 17, striped trenches (7a, 7b) are arranged side by side alternately in a plan view similarly to the second modification of the first embodiment. A dummy surface electrode 18 is arranged between the emitter surface electrode 15 and the gate surface electrode 16a, and a gate electrode pad 19 is arranged apart from the gate surface electrode 16a. The gate electrode 11c of the gate trench 7a is connected to the gate surface electrode 16a via the wiring layer 12d and the contact hole 13d. The bottom dummy conductive member 9b of the dummy trench 7b is connected to the dummy surface electrode 18 via the wiring layer 12e and the contact hole 13e. As shown in FIG. 18, an unitary gate electrode 11c is embedded inside the gate trench 7a via the gate insulating film 8a. Inside the dummy trench 7b, the upper embedded insulating film 10c is embedded in the upper part and the bottom dummy conductive member 9b is embedded under the upper embedded insulating film 10c via the dummy insulating film 8b. Further, as shown in FIG. 17, the IGBT according to the third embodiment includes a diode 22 and a resistance element 24. The diode 22 is arranged between the dummy surface electrode 18 and the gate surface electrode 16a for each of the dummy trenches 7b. The resistance element 24 is arranged between the gate surface electrode 16a and the gate electrode pad 19. An anode region 22a of the diode 22 is electrically connected to the gate surface electrode 16a via a contact hole 23a. A cathode region 22b of the diode 22 is electrically connected to the dummy surface electrode 18 via a contact hole 23b. One end of the resistance element 24 is electrically connected to the gate surface electrode 16a via a contact hole 23c, and the other end is electrically connected to the gate electrode pad 19 via a contact hole 23d. Since the other configurations of the IGBT according to the third embodiment are the same as those of the second modification of the first embodiment, duplicate description will be omitted.

Figure 19:
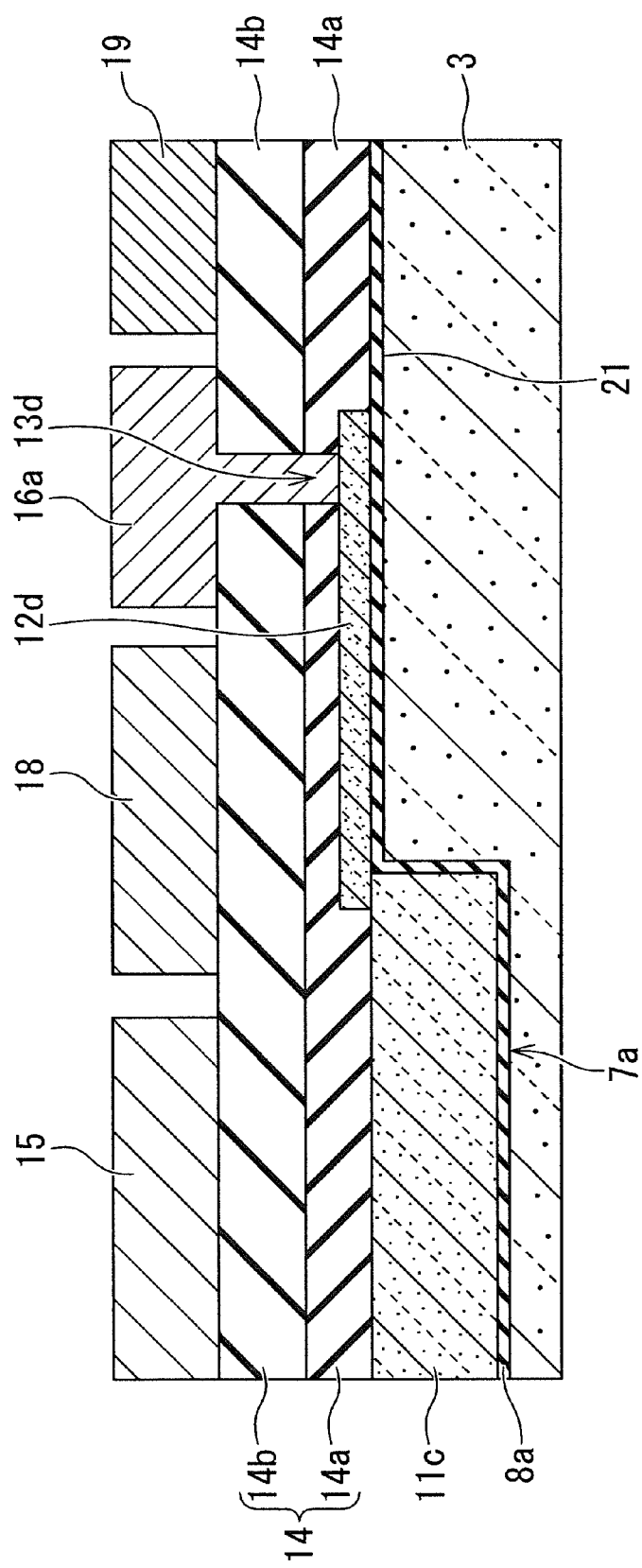
FIG. 19 is a schematic cross-sectional view seen from the direction of the line I-I in FIG. 17.
Figure 20:
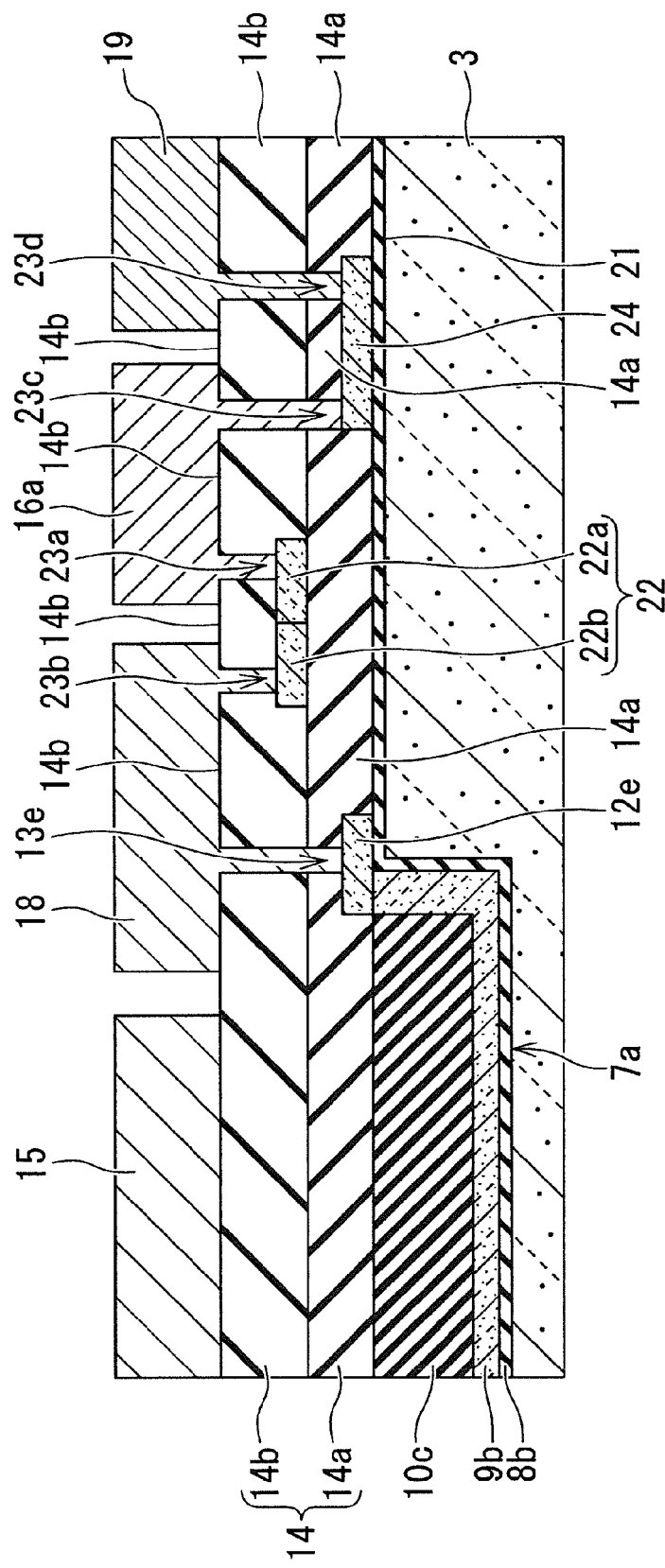
FIG. 20 is a schematic cross-sectional view seen from the direction of the line J-J in FIG. 17.

As shown in FIG. 19, at one end of the gate trench 7a in the extending direction, the wiring layer 12d is provided in physical contact with the gate electrode 11c and the upper surface of the field insulating film 21. An interlayer insulating film 14 is composed of a first interlayer insulating film 14a that covers the wiring layer 12d and a second interlayer insulating film 14b provided on the first interlayer insulating film 14a. The wiring layer 12d is electrically connected to the gate surface electrode 16a via a contact hole 13d penetrating the first and second interlayer insulating films 14a and 14b. As shown in FIG. 20, at one end of the dummy trench 7b in the extending direction, the wiring layer 12e is provided in physical contact with the bottom dummy conductive member 9b and the upper surface of the field insulating film 21. The bottom dummy conductive member 9b is electrically connected to the dummy surface electrode 18 via a contact hole 13e penetrating the first and second interlayer insulating films 14a and 14b.

As shown in FIG. 20, the diode 22 is provided between the first and second interlayer insulating films 14a and 14b. The anode region 22a of the diode 22 is electrically connected to the gate surface electrode 16a via the contact hole 23a provided in the second interlayer insulating film 14b. The cathode region 22b of the diode 22 is electrically connected to the dummy surface electrode 18 via the contact hole 23b provided in the second interlayer insulating film 14b. The resistance element 24 is provided on the upper surface of the field insulating film 21. One end and the other end of the resistance element 24 are electrically connected to the gate surface electrode 16a and the gate electrode pad 19 via contact holes 23c and 23d penetrating the first and second interlayer insulating films 14a and 14b, respectively. The anode region 22a and the cathode region 22b of the diode 22 are formed by using low impurity concentration doped polysilicon layers that are ion-implanted with p-type impurities and n-type impurities, respectively. A doped polysilicon layer is used for the resistance element 24, and the resistance value is controlled by the width of the doped polysilicon layer. Although the resistance element 24 is used to control the turn-on time, a wiring layer made of a doped polysilicon layer having a high impurity concentration may be arranged instead of the resistance element 24.

Figure 21:
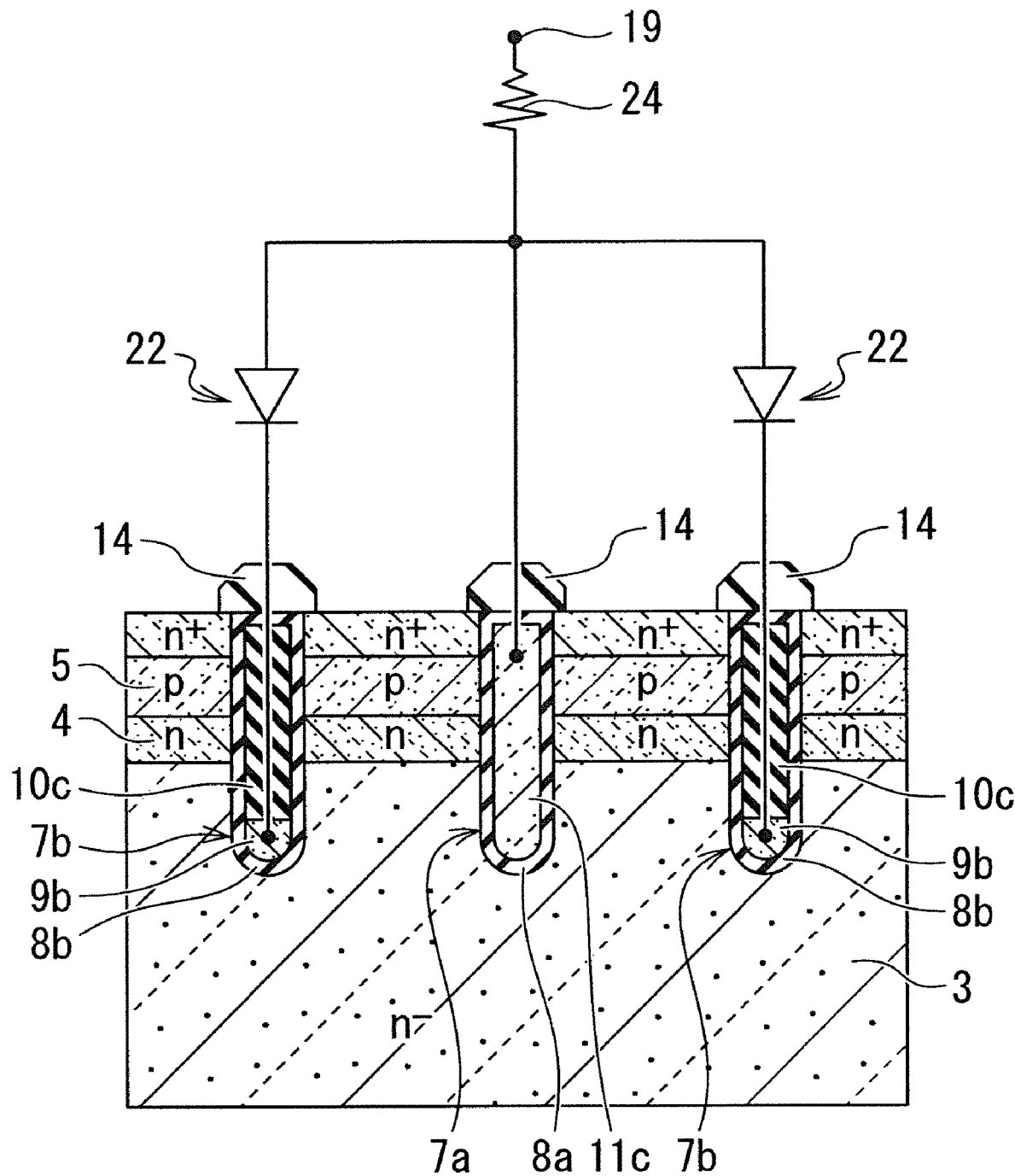
FIG. 21 is a schematic cross-sectional view showing a connection between the trenches and the diode in the IGBT of the third embodiment.

FIG. 21 schematically shows the connection among the gate electrode 11c of the trench (7a, 7b), the bottom dummy conductive member 9b to the diode 22, and the resistance element 24. As shown in FIG. 21, the gate electrode 11c of the gate trench 7a is electrically connected to the gate potential applied to the gate electrode pad 19 via the resistance element 24. Further, the bottom dummy conductive member 9b of the dummy trench 7b is electrically connected to the gate potential via the resistance element 24 and the diode 22.

Figure 22:
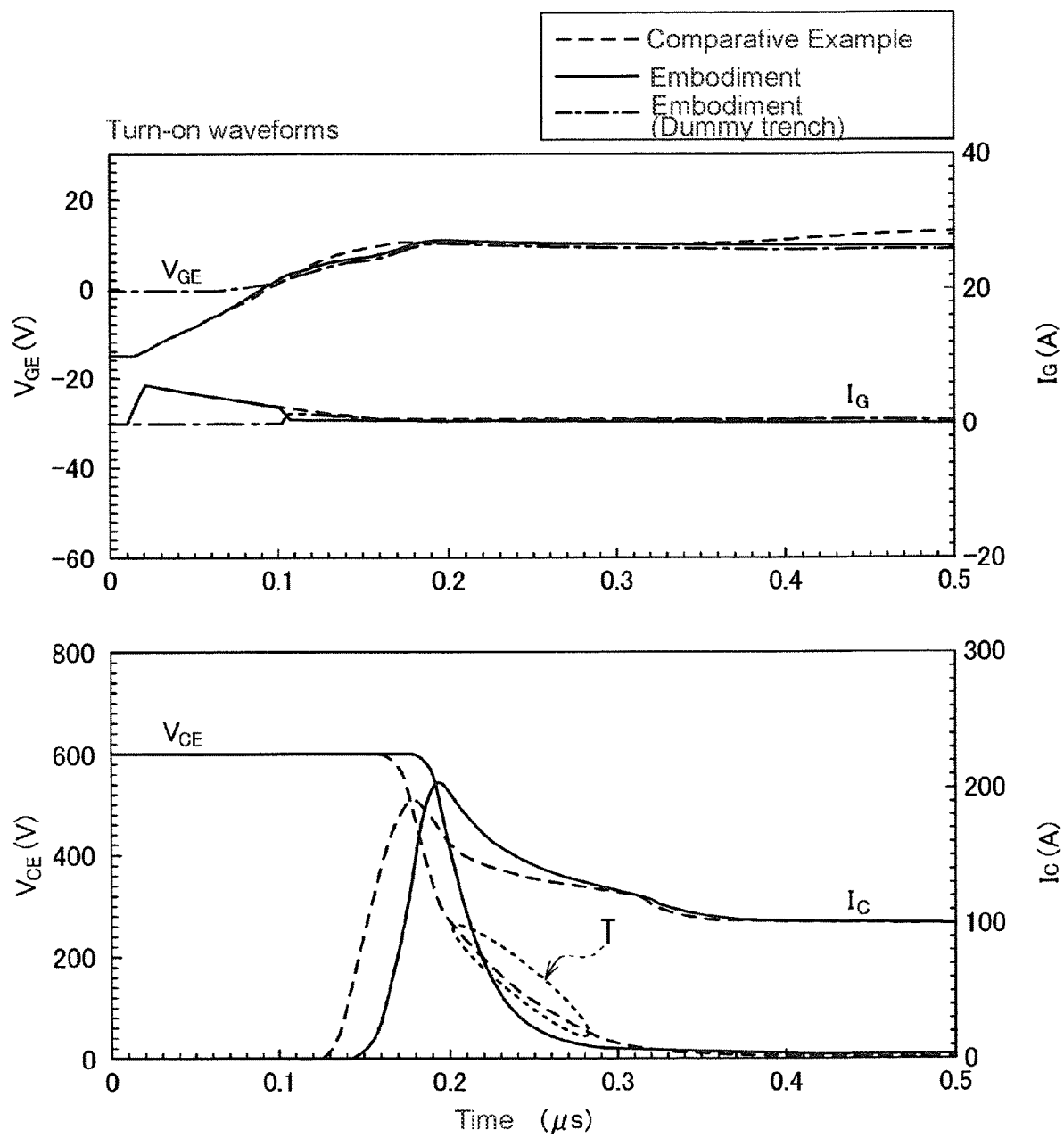
FIG. 22 is a diagram showing an example of simulated turn-on waveforms of the IGBT of the third embodiment.
Figure 23:
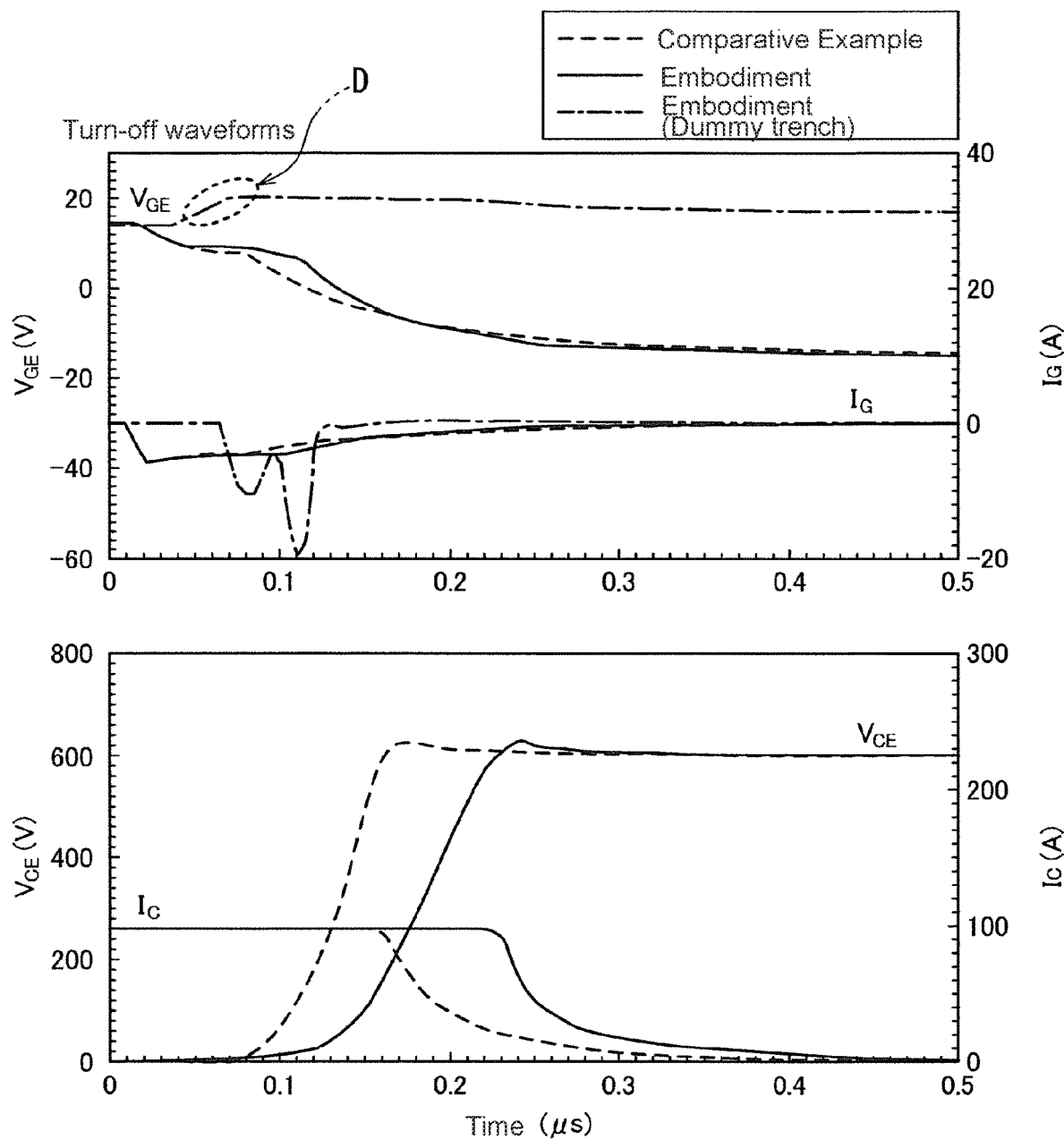
FIG. 23 is a diagram showing an example of simulated turn-off waveforms of the IGBT of the third embodiment.

FIGS. 22 and 23 show the simulated turn-on waveforms and the simulated turn-off waveforms of the IGBT of the third embodiment, assuming that the collector current $I_C$ is about 100 A. Here, in the upper graphs of these figures, for the third embodiment device, voltage and current at the gate electrode 11c of the gate trench 7a are depicted by the solid lines, and voltage and current at the bottom dummy conductive member 9b of the dummy trench 7b are depicted by the alternate long and short dash lines. Further, as a comparative example, an IGBT having a unitary dummy electrode 11d in the dummy trench 7b shown in FIG. 7 is used. As shown in FIG. 22, in the third embodiment, the time change rate dv/dt of the collector voltage $V_{CE}$ drops almost constantly, but in the comparative example, it is not constant and a voltage tail T is generated. In the waveforms of the gate voltage $V_{GE}$ of the gate electrode 11c in the gate trench 7a and the gate voltage in the comparative example, the gate voltage $V_{GE}$ starts the turn-on operation from −15V. On the other hand, in the waveform of the gate voltage $V_{GE}$ at the bottom dummy conductive member 9b in the dummy trench 7b, since the bottom dummy conductive member 9b is connected to the diode 22, the turn-on operation is started from 0V. As shown in FIG. 23, as the collector voltage $V_{CE}$ increases, the collector current $I_C$ decreases. The gate voltages $V_{GE}$ at the gate electrode 11c in the gate trench 7a of the embodiment and the gate voltage in the comparative example are both rapidly reduced after the gate voltage is cut off. On the other hand, the gate voltage $V_{GE}$ at the bottom dummy conductive member 9b in the dummy trench 7b rises sharply in the time zone D of 0.03 μsec to 0.07 μsec from the time of the turn off, and then gradually decreases. Even if the gate voltage $V_{GE}$ of the bottom dummy conductive member 9b decreases, the diode 22 is in a reverse bias state and no current flows, and the potential around the dummy trench 7b does not decrease. Since the potential around the dummy trench 7b is maintained even when the IGBT is off, the gate current $I_G$ hardly flows during the subsequent turn-on, and the total gate charge Qg can be suppressed. The sharp rise in the gate voltage $V_{GE}$ shown in FIG. 23 is due to the displacement current due to the sharp change in the potential around the dummy trench 7b. It is necessary to control the impurity concentration in the anode region 22a and the cathode region 22b to determine the withstand voltage of the diode 22 so that the gate voltage $V_{GE}$ does not become too high in the time zone D. For example, in order to suppress the gate voltage $V_{GE}$ so as not to exceed 20V, the withstand voltage of the diode 22 may be set to about 35V. The other effects of the IGBT of the third embodiment are the same as those of the IGBT according to the second modification of the first embodiment.

Other Embodiments

Although the present invention has been described by the embodiments described above, the statements and drawings that form part of this disclosure should not be understood as limiting the invention. It should be considered from this disclosure to those skilled in the art that various alternative embodiments, examples and operational techniques will be revealed.

In the first and second embodiments, silicon (Si) has been used as the material of the semiconductor substrate, but the semiconductor material is not limited, and wide bandgap semiconductor, such as silicon carbide (SiC) or gallium nitride (GaN), may be used.

As described above, the present invention includes various forms of implementations not explicitly described above, and the technical scope of the present invention is defined only by the matters specifying the invention relating to the reasonable claims from the above description. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An insulated gate bipolar transistor, comprising:
a drift layer made of semiconductor of a first conductivity type;
a base region made of semiconductor of a second conductivity type on the drift layer;
an emitter region made of semiconductor of the first conductivity type on the base region, an impurity concentration of the emitter region being higher than that in the drift layer;
a gate electrode embedded in a gate trench through a gate insulating film, the gate trench penetrating the emitter region and the base region, the gate trench extending in a first direction in a plan view; and
a dummy electrode embedded in a dummy trench through a dummy insulating film, the dummy trench penetrating the emitter region and the base region and extending in parallel with the gate trench in the first direction in a plan view, the dummy trench being disposed on each side of the gate trench and laterally spaced from each side of the gate trench so as to laterally face the gate trench through the base region,
wherein the gate electrode is configured to be electrically connected to a gate potential, and
wherein the dummy electrode includes a bottom dummy conductive member disposed at a bottom of the dummy trench such that an upper surface of the bottom dummy conductive member is located lower than a lower surface of the base region, the bottom dummy conductive member being configured to be electrically connected to the gate potential.

2. The insulated gate bipolar transistor according to claim 1, wherein the dummy electrode further includes an upper dummy conductive member that is disposed over the bottom dummy conductive member through a split insulating film, the upper dummy conductive member being configured to be electrically connected to an emitter potential.

3. The insulated gate bipolar transistor according to claim 1, wherein the dummy trench further includes an upper embedded insulating film filles on the bottom dummy conductive member.

4. The insulated gate bipolar transistor according to claim 1, wherein the gate electrode in the gate trench comprises a bottom gate conductive member at a bottom of the gate trench and an upper gate conductive member that is provided over the bottom gate conductive through an insulating film, an upper surface of the bottom gate conductive member being located lower than the lower surface of the base region.

5. The insulated gate bipolar transistor according to claim 1, further comprising a trench bottom floating layer below the base region, the trench bottom floating layer covering the bottom of the dummy trench and being made of semiconductor of the second conductivity type second conductive type, an upper surface of the trench bottom floating layer being located higher than an upper surface of the bottom dummy conductive member in the dummy trench.

6. The insulated gate bipolar transistor according to claim 1, further comprising an accumulation layer made of semiconductor of the first conductivity type below the base region.

7. The insulated gate bipolar transistor according to claim 1, further comprising a diode having an anode region and a cathode region, the anode region being configured to be electrically connected to the gate potential, and the cathode region being electrically connected to the bottom dummy conductive member.

8. The insulated gate bipolar transistor according to claim 7, further comprising a resistance element, one end of the resistance element being configured to be electrically connected to the gate potential, another end of the resistance element being electrically connected to the anode region of the diode and to the gate electrode.

9. The insulated gate bipolar transistor according to claim 1, wherein the gate trench and the dummy trench are both provided in a plurality, and the plurality of the gate trenches and the plurality of the dummy trenches are arranged in a striped shape so as to be parallel to each other in the plan view.

10. The insulated gate bipolar transistor according to claim 1,
wherein the dummy electrode further includes an upper dummy conductive member that is disposed over the bottom dummy conductive member through a split insulating film, the upper dummy conductive member being configured to be electrically connected to an emitter potential, and
wherein the gate electrode in the gate trench comprises a bottom gate conductive member at a bottom of the gate trench and an upper gate conductive member that is provided over the bottom gate conductive through a split insulating film, an upper surface of the bottom gate conductive member being located lower than the lower surface of the base region, the bottom gate conductive member and the upper gate conductive member being both configured to be electrically connected to the gate potential.

* * * * *